(12) United States Patent
Park

(10) Patent No.: US 12,167,638 B2
(45) Date of Patent: Dec. 10, 2024

(54) TRANSPARENT DISPLAY DEVICE

(71) Applicant: LG Display Co., Ltd., Seoul (KR)

(72) Inventor: JaeHee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 392 days.

(21) Appl. No.: 17/551,995

(22) Filed: Dec. 15, 2021

(65) Prior Publication Data

US 2022/0199728 A1 Jun. 23, 2022

(30) Foreign Application Priority Data

Dec. 17, 2020 (KR) .......................... 10-2020-0177240

(51) Int. Cl.
| | |
|---|---|
| *H10K 59/121* | (2023.01) |
| *G09G 3/3225* | (2016.01) |
| *H01L 27/12* | (2006.01) |
| *H10K 50/813* | (2023.01) |
| *H10K 59/12* | (2023.01) |
| *H10K 59/123* | (2023.01) |
| *H10K 59/131* | (2023.01) |
| *H10K 59/35* | (2023.01) |
| *H10K 71/00* | (2023.01) |

(52) U.S. Cl.
CPC ..... *H10K 59/1213* (2023.02); *H10K 59/1216* (2023.02); *H10K 59/131* (2023.02); *H10K 59/353* (2023.02)

(58) Field of Classification Search
CPC ................ H01L 27/124; H10K 59/131; H10K 59/1216; H10K 59/123; H10K 59/353; H10K 59/121; H10K 59/351; H10K 59/12; G09G 3/3225
See application file for complete search history.

(56) References Cited

U.S. PATENT DOCUMENTS

| | | | |
|---|---|---|---|
| 10,276,641 | B2 | 4/2019 | Lou |
| 10,756,136 | B1 | 8/2020 | Ma et al. |
| 10,867,542 | B2 | 12/2020 | Jo et al. |
| 2013/0320314 | A1 | 12/2013 | Kim et al. |

(Continued)

FOREIGN PATENT DOCUMENTS

| | | |
|---|---|---|
| CN | 110061014 A | 7/2019 |
| EP | 3346501 A1 | 7/2018 |

(Continued)

*Primary Examiner* — Sonya McCall-Shepard
(74) *Attorney, Agent, or Firm* — Seed IP Law Group LLP

(57) ABSTRACT

A transparent display device may prevent deterioration of light transmittance, which is caused by a repair line, from occurring. The transparent display device comprises a substrate provided with transmissive areas, a non-transmissive area disposed between the transmissive areas, and a plurality of subpixels disposed in the non-transmissive area, a first electrode provided in each of the plurality of subpixels, a driving transistor connected with the first electrode of each of the plurality of subpixels, including an active layer, a gate electrode, a source electrode and a drain electrode, a capacitor connected to the driving transistor of each of the plurality of subpixels, including a first capacitor electrode and a second capacitor electrode, and an anode line extended from the first electrode of each of the plurality of subpixels to at least partially overlap a driving transistor or a capacitor of an adjacent subpixel of the same color.

24 Claims, 14 Drawing Sheets

(56) References Cited

U.S. PATENT DOCUMENTS

| | | | |
|---|---|---|---|
| 2016/0189593 A1 | 6/2016 | Lee et al. | |
| 2018/0358420 A1 | 12/2018 | Nam et al. | |
| 2019/0355288 A1* | 11/2019 | Choi | H10K 59/80515 |
| 2020/0013992 A1 | 1/2020 | Cheng | |
| 2020/0066817 A1 | 2/2020 | Kim | |
| 2020/0083312 A1 | 3/2020 | Kim et al. | |

FOREIGN PATENT DOCUMENTS

| | | |
|---|---|---|
| KR | 10-2019-0008683 A | 1/2019 |
| KR | 10-2020-0029226 A | 3/2020 |
| TW | 201401504 A | 1/2014 |
| TW | 201735344 A | 10/2017 |

\* cited by examiner

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

BRIEF SUMMARY

A transparent display device includes a display area on which an image is displayed, and a non-display area, wherein the display area may include a transmissive area that may transmit light, and a non-transmissive area. The transparent display device may have high light transmittance in the display area through the transmissive area. The inventors of the present disclosure have recognized that when a defective subpixel occurs, a Weighted Data for Redundancy (WDR) technique for normally operating the defective subpixel using a repair line may be applied to the transparent display device. However, in the transparent display device to which the WDR technique is applied, a size of the transmissive area may be reduced by the repair line, whereby light transmittance may be deteriorated.

One or more embodiments of the present disclosure has been made in view of various technical problems including the above problems, and various embodiments of the present disclosure provide a transparent display device that may prevent decrease of light transmittance, which is caused by a repair line, from occurring.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with transmissive areas, a non-transmissive area disposed between the transmissive areas, and a plurality of subpixels disposed in the non-transmissive area, a first electrode provided in each of the plurality of subpixels, a driving transistor supplying a power source to a first electrode of each of the plurality of subpixels, including an active layer, a gate electrode, a source electrode and a drain electrode, a capacitor connected to the driving transistor of each of the plurality of subpixels, including a first capacitor electrode and a second capacitor electrode, and an anode line extended from the first electrode of each of the plurality of subpixels to at least partially overlap a driving transistor or a capacitor of an adjacent subpixel of the same color.

In accordance with another aspect of the present disclosure, the above and other technical benefits can be accomplished by the provision of a transparent display device comprising a substrate provided with transmissive areas, a non-transmissive area disposed between the transmissive areas, and a plurality of subpixels disposed in the non-transmissive area, a first electrode provided in each of the plurality of subpixels, and an anode line disposed between subpixels of the same color, which face each other with the transmissive area interposed therebetween.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
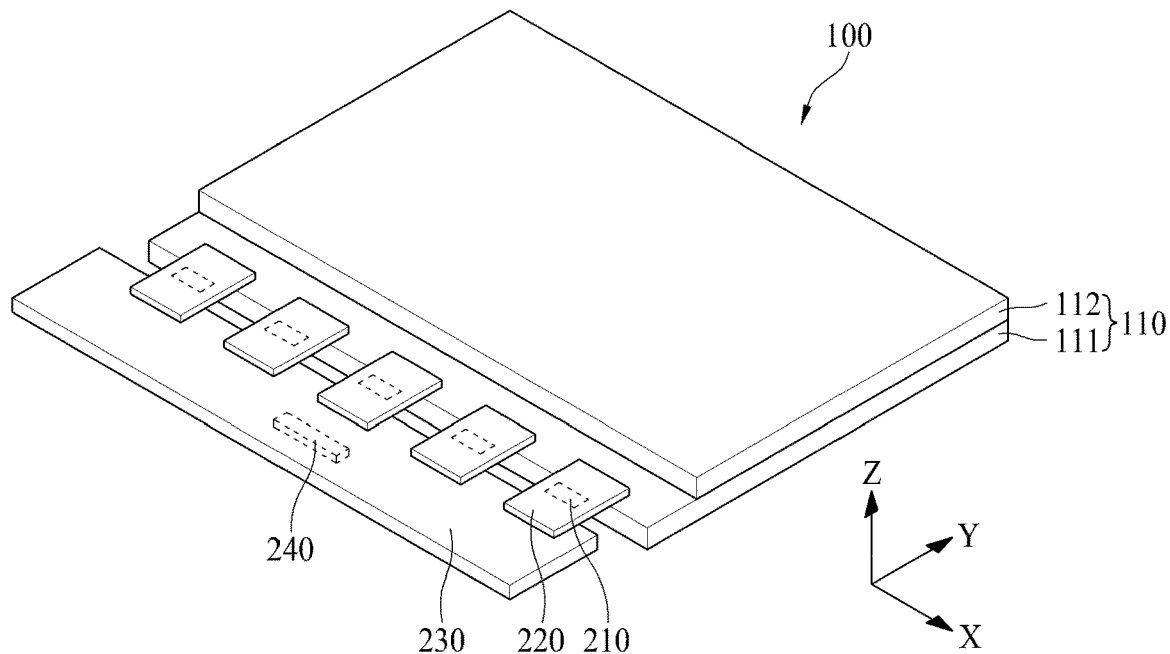
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second." etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
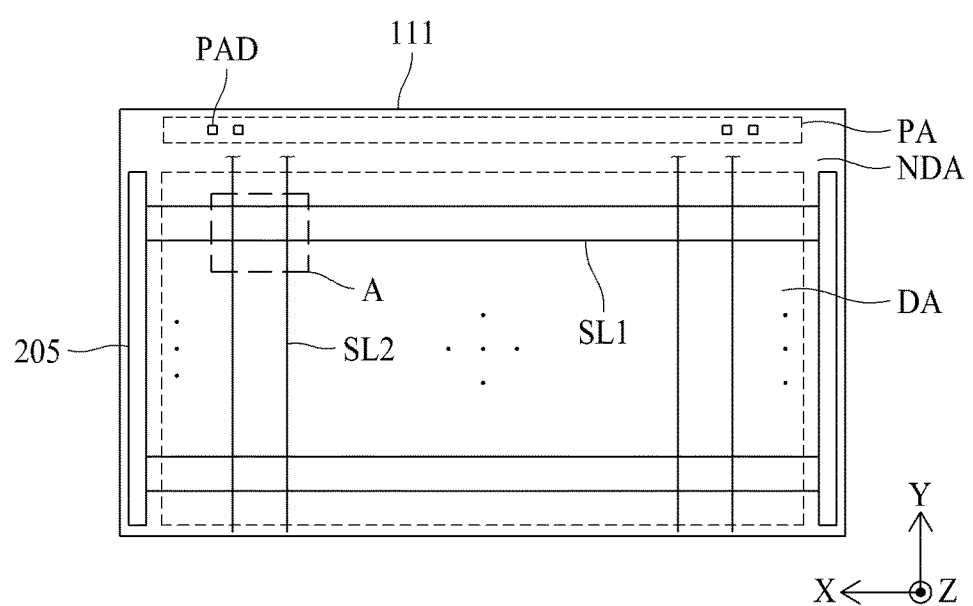
FIG. 2 is a schematic plane view illustrating a transparent display panel according to one embodiment of the present disclosure.
Figure 3:
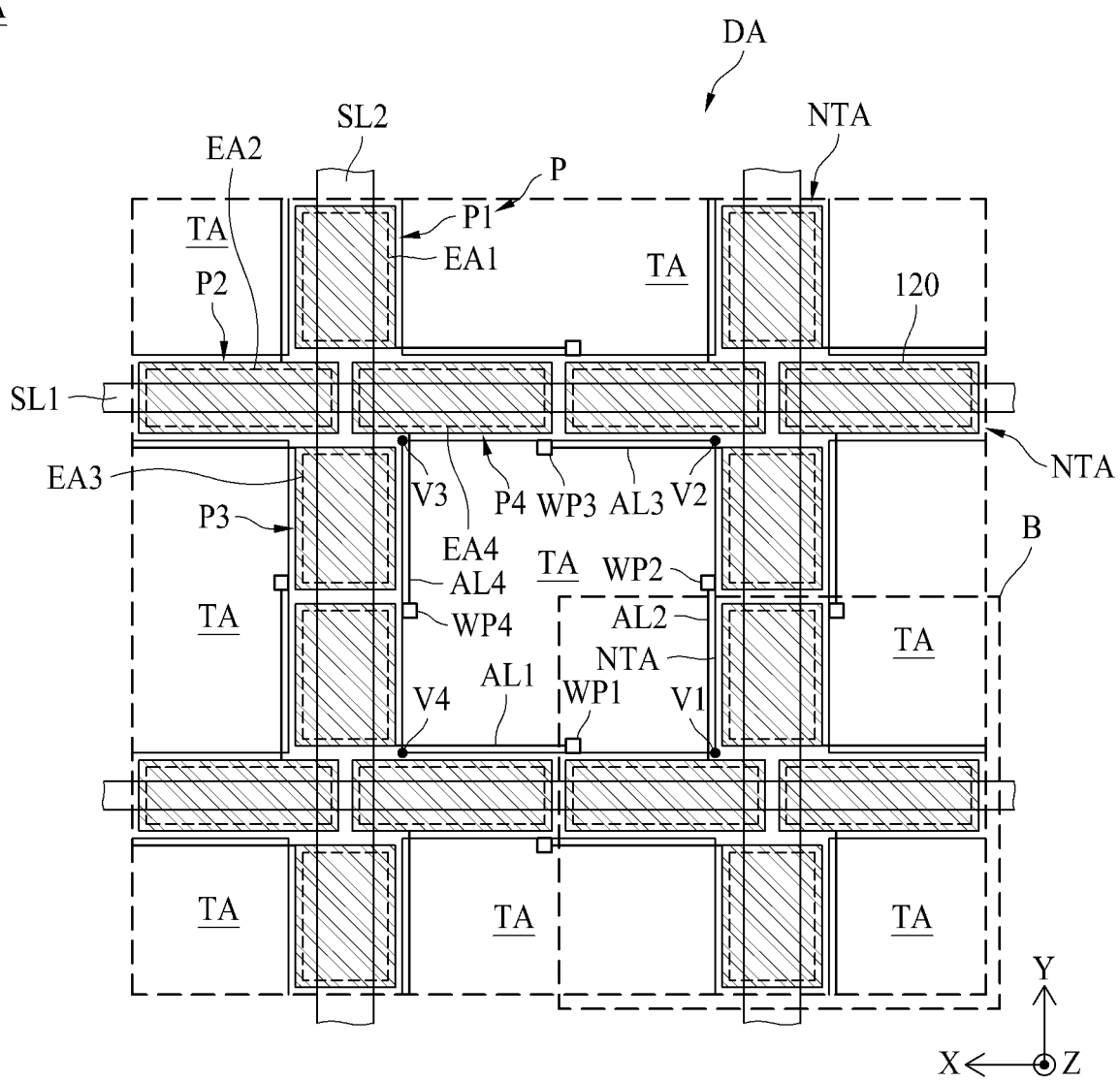
FIG. 3 is an enlarged view illustrating an area A of FIG. 2.

FIG. 2 is a schematic plane view illustrating a transparent display panel according to one embodiment of the present disclosure, and FIG. 3 is an enlarged view illustrating an area A of FIG. 2.

Referring to FIG. 2 and FIG. 3, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 is connected to the scan lines and supplies scan signals to the scan lines. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided only in one side of the display area DA of the transparent display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than β %, for example, about 50%. At this time, α is greater than β. A user may view an object or background arranged over a rear surface of the transparent display panel 110 due to the transmissive area TA.

The non-transmissive area NTA may include a plurality of pixels P, and a plurality of first signal lines SL1 and a plurality of second signal lines SL2 to supply signals to each of a plurality of pixels P.

The plurality of first signal lines SL1 may be extended in a first direction (e.g., X-axis direction). The plurality of first signal lines SL1 may cross the plurality of second signal lines SL2. For example, each of the plurality of first signal lines SL1 may include at least one scan line.

Hereinafter, when the first signal line SL1 includes a plurality of lines, one first signal line SL1 may refer to a signal line group including a plurality of lines. For example, when the first signal line SL1 includes two scan lines, one first signal line SL1 may refer to a signal line group including two scan lines.

The plurality of second signal lines SL2 may be extended in a second direction (e.g., Y-axis direction). For example, each of the plurality of second signal lines SL2 may include at least one of at least one data line, a pixel power line, a reference line, or a common power line.

Hereinafter, when the second signal line SL2 includes a plurality of lines, one second signal line SL2 may refer to a signal line group including a plurality of lines. For example, when the second signal line SL2 includes two data lines, a pixel power line, a common power line, and a reference line, one second signal line SL2 may refer to a signal line group including two data lines, a pixel power line, a common power line, and a reference line.

A transmissive area TA may be disposed between the first signal lines SL1 adjacent to each other. In addition, a transmissive area TA may be disposed between the second signal lines SL2 adjacent to each other. That is, the transmissive area TA may be surrounded by two first signal lines SL1 and two second signal lines SL2. For example, the transmissive area TA may have a rectangular shape surrounded by two first signal lines SL1 and two second signal lines SL2. The transmissive area TA may have a rectangular shape including four corners. The transmissive area TA may include a first corner V1, a second corner V2 facing the first corner V1 in the second direction, a third corner V3 facing the second corner V2 in the first direction, and a fourth corner V4 facing the first corner V1 in the first direction.

Pixels P may be provided to overlap at least one of the first signal line SL1 and the second signal line SL2, thereby emitting predetermined light to display an image. An emission area EA may correspond to an area, from which light is emitted, in the pixel P.

Each of the pixels P may include at least one three subpixels, preferably four subpixels, configured to emit at different colors, respectively. Each of the pixels P may include at least one of a first subpixel P1, a second subpixel P2, a third subpixel P3 and a fourth subpixel P4. The first subpixel P1 may include a first emission area EA1 emitting light of a green color. The second subpixel P2 may include a second emission area EA2 emitting light of a red color. The third subpixel P3 may include a third emission area EA3 emitting light of a white color. The fourth subpixel P4 may include a fourth emission area EA4 emitting light of a blue color. However, the emission areas are not limited to this example. Each of the pixels P may further include a subpixel emitting light of a color other than red, green, blue and white. Also, the arrangement order of the subpixels P1, P2, P3 and P4 may be changed in various ways.

Hereinafter, for convenience of description, the description will be given based on that a first subpixel P1 is a green subpixel emitting green light, a second subpixel P2 is a red subpixel emitting red light, a third subpixel P3 is a white subpixel emitting white light, and a fourth subpixel P4 is a blue subpixel emitting blue light.

The second subpixel P2 and the fourth subpixel P4 may be provided to overlap at least a portion of the first signal line SL1, and may alternately be disposed along the first signal line SL1.

The first subpixel P1 and the third subpixel P3 may be provided to overlap at least a portion of the second signal line SL2, and may alternately be disposed along the second signal line SL2.

As shown in FIG. 3, the second subpixel P2 and the fourth subpixel P4 may be provided in an area where the first signal line SL1 and the second signal line SL2 cross or overlap each other, but are not limited thereto.

In another embodiment, the first subpixel P1 and the third subpixel P3 may be disposed in the area where the first signal line SL1 and the second signal line SL2 cross or overlap each other. In this case, the second subpixel P2 and the fourth subpixel P4 may be spaced apart from each other with the first subpixel P1 and the third subpixel P3, which are interposed therebetween in the area where the first signal line SL1 and the second signal line SL2 cross or overlap each other.

In some embodiments, the first subpixel P1 and the third subpixel P3 are arranged symmetrically with respect to the overlapping location between the first signal line SL1 and the second signal line SL2. Similarly, the second subpixel P2 and the fourth subpixel P4 are arranged symmetrically with respect to the overlapping location between the first signal line SL1 and the second signal line SL2.

Each of the first subpixel P1, the second subpixel P2, the third subpixel P3 and the fourth subpixel P4 may include a circuit element, which includes a capacitor, a thin film transistor, and the like, and a light emitting diode. The thin film transistor may include a switching transistor, a sensing transistor, and a driving transistor.

The switching transistor is switched in accordance with scan signals supplied to the scan lines to supply data voltages supplied from the data lines to the driving transistor.

The sensing transistor serves to sense a threshold voltage deviation of the driving transistor, which causes deterioration of picture quality.

The driving transistor is switched in accordance with a data voltage supplied from a switching thin film transistor to generate a data current from a power source supplied from the pixel power line, thereby serving to supply the generated data current to a first electrode of a subpixel. The driving transistor includes an active layer, a gate electrode, a source electrode and a drain electrode.

The capacitor serves to maintain the data voltage supplied to the driving transistor for one frame of time. The capacitor may include two capacitor electrodes, but is not limited thereto. In one embodiment, the capacitor may include three capacitor electrodes.

Figure 4:
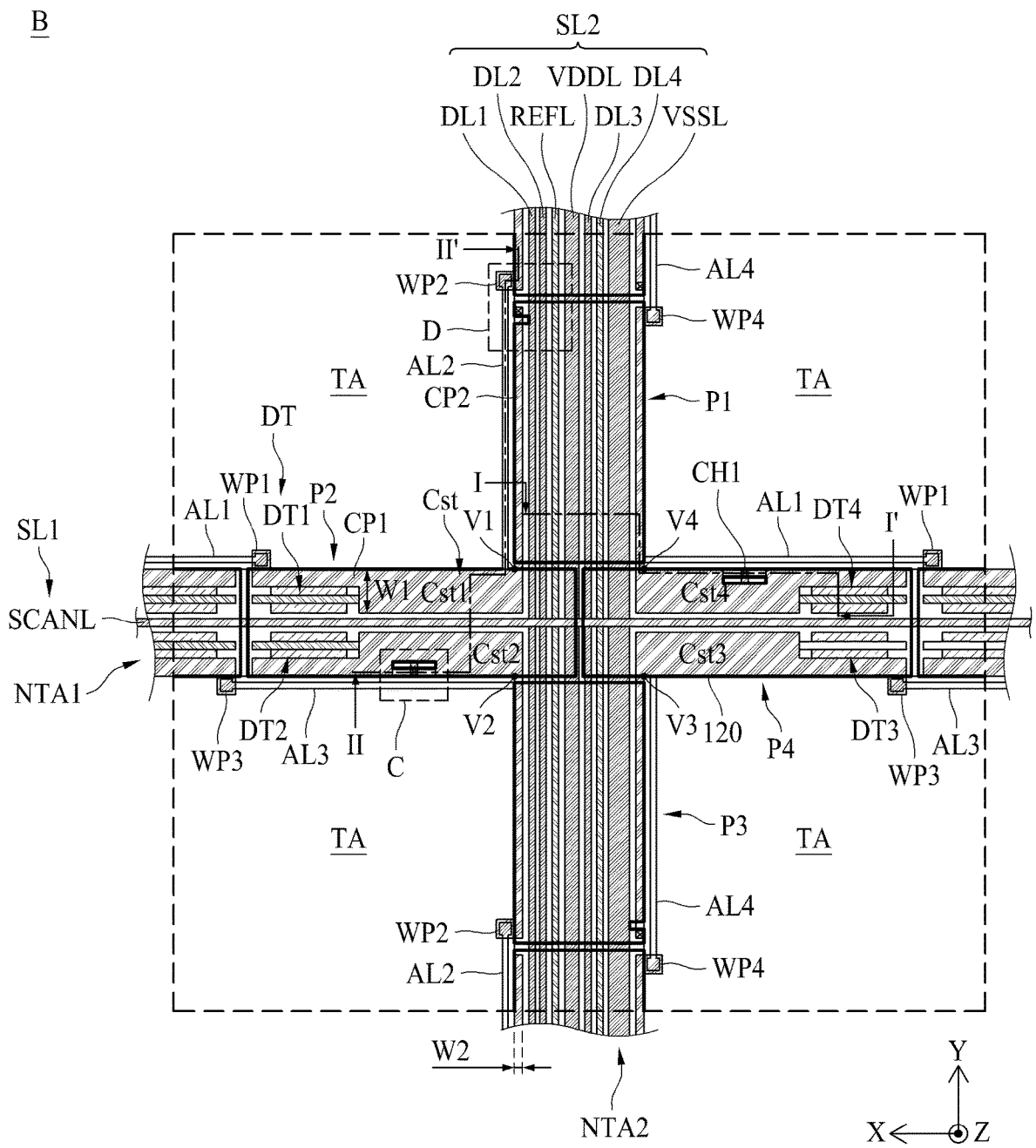
FIG. 4 is an enlarged view illustrating an area B of FIG. 3.

The transparent display panel 110 according to one embodiment of the present disclosure is characterized in that the capacitor has an L-shape as can be seen from the top view of FIG. 4. In more detail, the capacitor according to one embodiment of the present disclosure may include a first capacitor pattern portion longitudinally provided in the first direction between the first signal line SL1 and the transmissive area TA and a second capacitor pattern portion extended from one end of the first capacitor pattern portion and longitudinally provided in the second direction between the second signal line SL2 and the transmissive area TA.

In the transparent display panel 110 according to one embodiment of the present disclosure, an anode line AL is provided between two subpixels of the same color, which face each other with the transmissive area TA interposed therebetween, and a welding point may be provided at an end of the anode line AL. The anode line AL may include a first anode line AL1, a second anode line AL2, a third anode line AL3, and a fourth anode line AL4.

In detail, the first anode line AL1 may be protruded from a first electrode of one of first subpixels P1 facing each other with the transmissive area TA interposed therebetween and extended toward the other first subpixel P1, and a first welding point WP1 may be provided at an end of the first anode line AL1. The first anode line AL1 may be extended in a first direction along a first side of the transmissive area TA. For example, the first anode line AL1 may be extended from a fourth corner V4 to a first corner V1 of the transmissive area TA as much as a first length. In this case, the first length may be shorter than a spaced distance between the first subpixels P1 facing each other with the transmissive area TA interposed therebetween.

The third anode line AL3 is protruded from a first electrode of one of third subpixels P3 facing each other with the transmissive area TA interposed therebetween and extended toward the other third subpixel P3, and a third welding point WP3 may be provided at an end of the third anode line AL3. The third anode line AL3 may be extended in the first direction along a second side facing the first side of the transmissive area TA. For example, the third anode line AL3 may be extended from a second corner V2 to a third corner V3 of the transmissive area TA as much as a third length. In this case, the third length may be shorter than a spaced distance between the third subpixels P3 facing each other with the transmissive area TA interposed therebetween.

The second anode line AL2 is protruded from a first electrode of one of second subpixels P2 facing each other with the transmissive area TA interposed therebetween and extended toward the other second subpixel P2, and a second welding point WP2 may be provided at an end of the second anode line AL2. The second anode line AL2 may be extended in a second direction along a third side connecting the first side with the second side of the transmissive area TA. For example, the second anode line AL2 may be extended from the first corner V1 to the second corner V2 of the transmissive area TA as much as a second length. In this case, the second length may be shorter than a spaced distance between the second subpixels P2 facing each other with the transmissive area TA interposed therebetween.

The fourth anode line AL4 is protruded from a first electrode of one of fourth subpixels P4 facing each other with the transmissive area TA interposed therebetween and extended toward the other fourth subpixel P4, and a fourth welding point WP4 may be provided at an end of the fourth anode line AL4. The fourth anode line AL4 may be extended in the second direction along a fourth side facing the third side of the transmissive area TA. For example, the fourth anode line AL4 may be extended from the third corner V3 to a fourth corner V4 of the transmissive area TA as much as a fourth length. In this case, the fourth length may be shorter than a spaced distance between the fourth subpixels P4 facing each other with the transmissive area TA interposed therebetween.

Hereinafter, the capacitor having an L-shape, the driving transistor, the anode lines, the plurality of signal lines, and the light emitting diode will be described in detail with reference to FIGS. 4 to 8.

Figure 5:
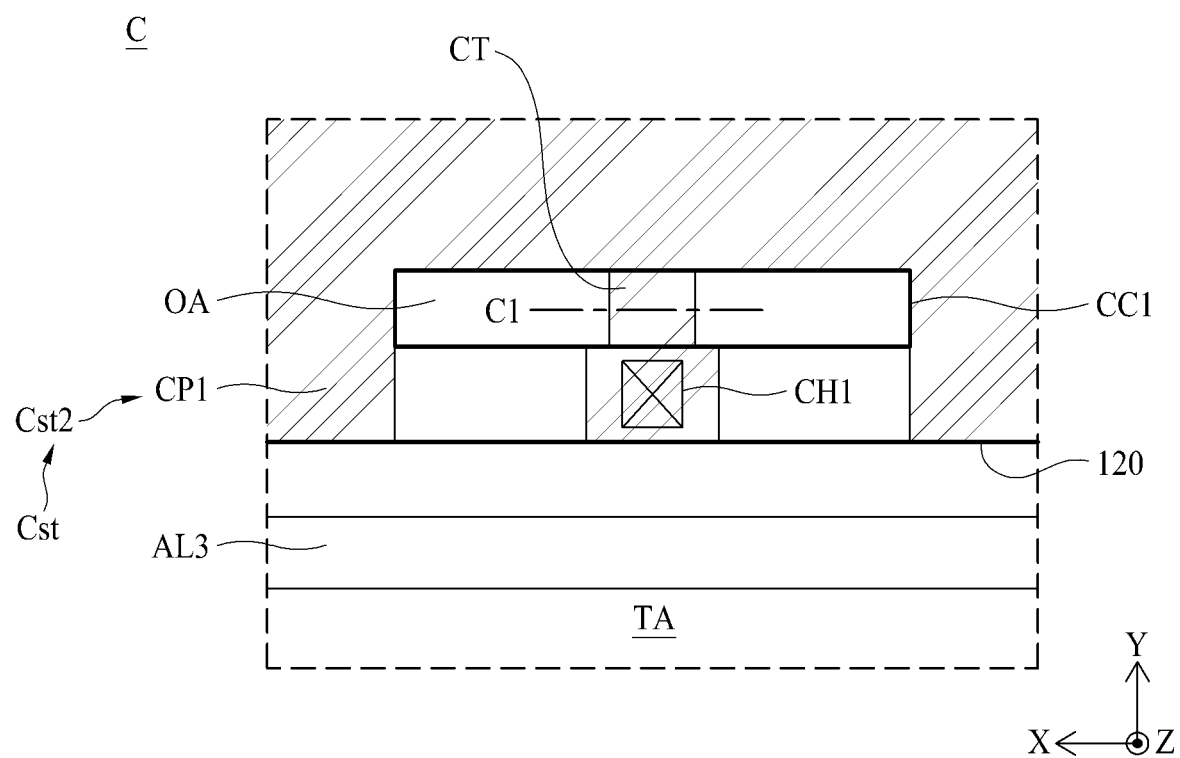
FIG. 5 is an enlarged view illustrating an area C of FIG. 4.
Figure 6:
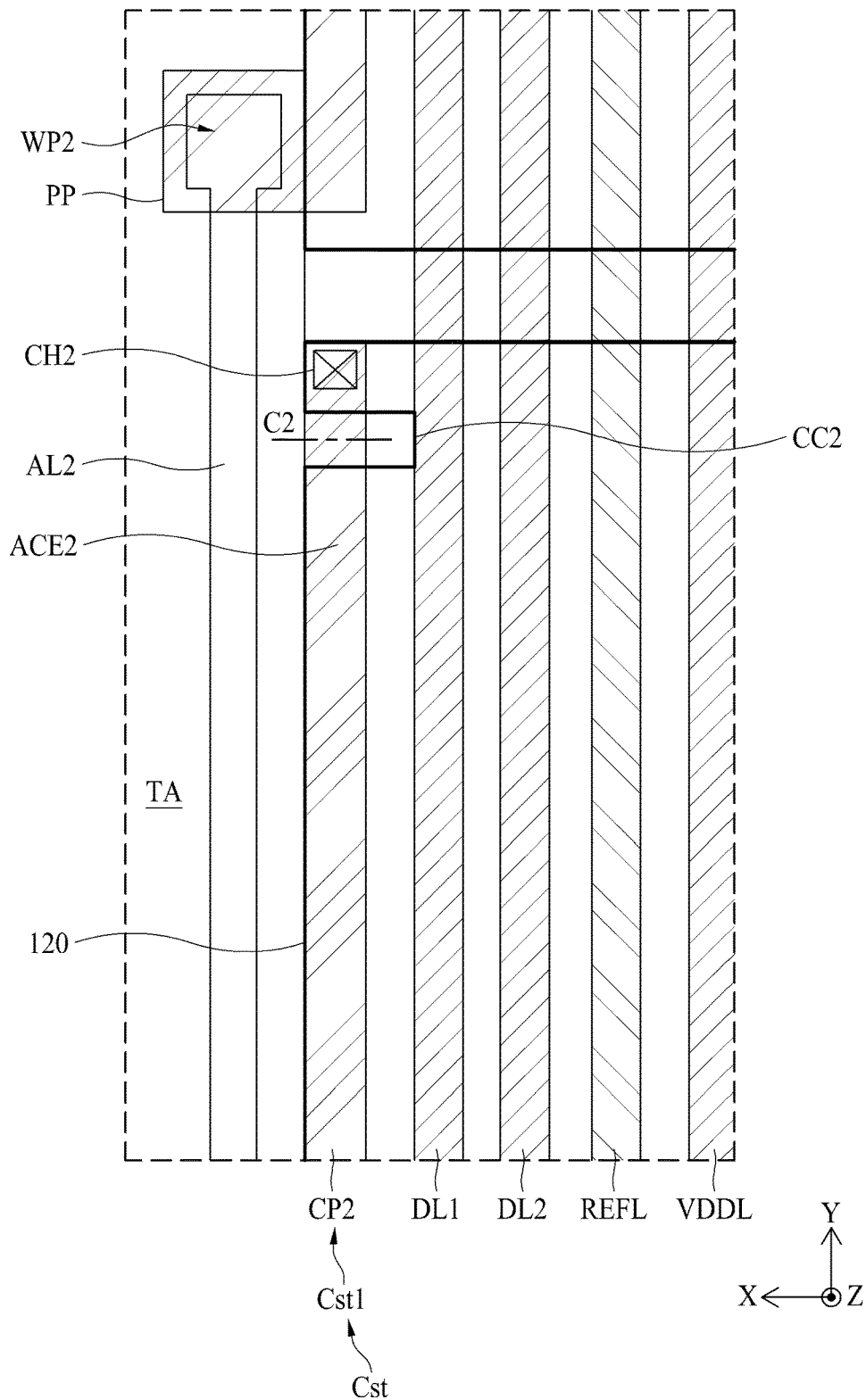
FIG. 6 is an enlarged view illustrating an area D of FIG. 4.
Figure 7:
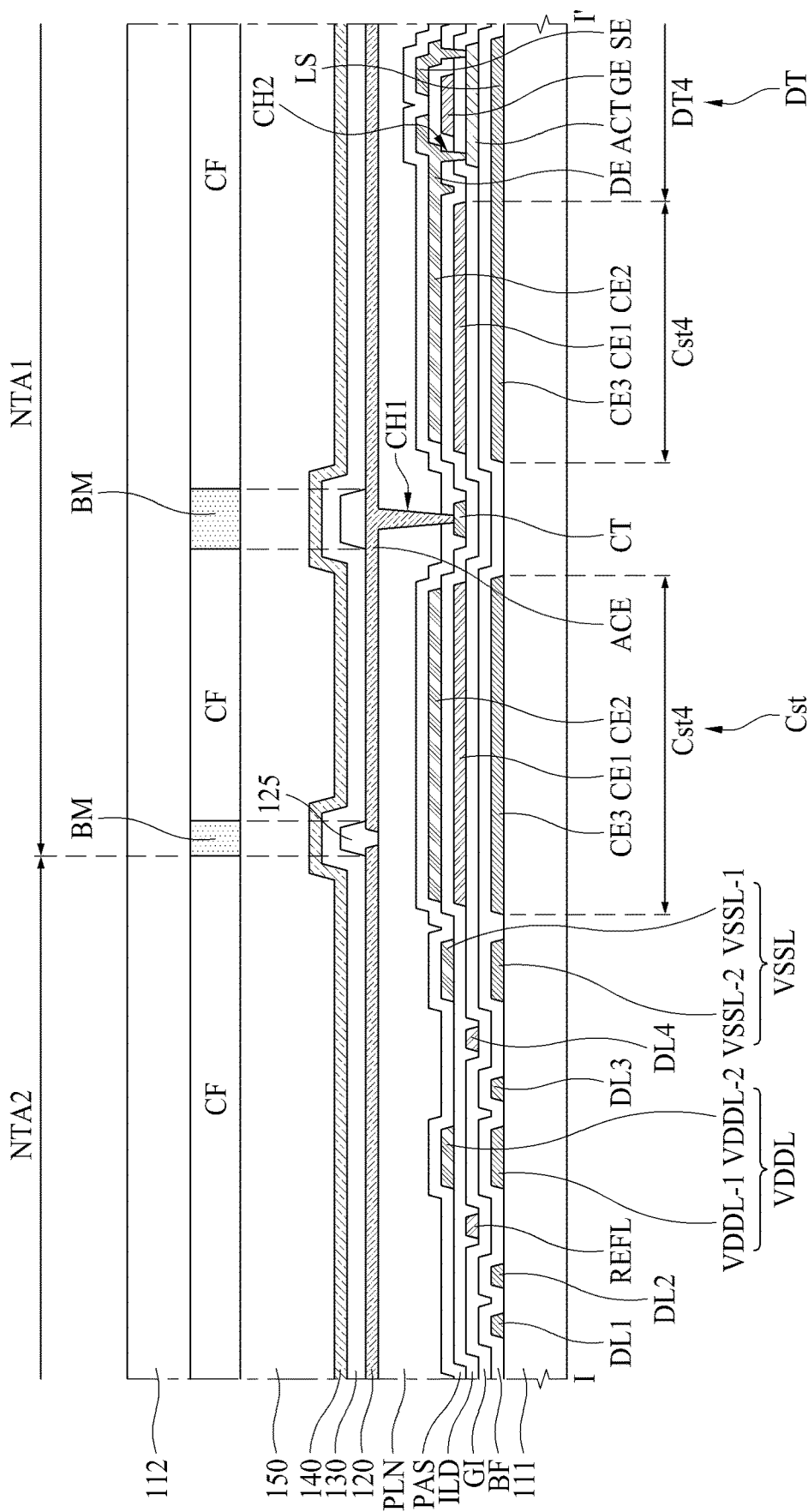
FIG. 7 is a cross-sectional view taken along line I-I' of FIG. 4.
Figure 8:
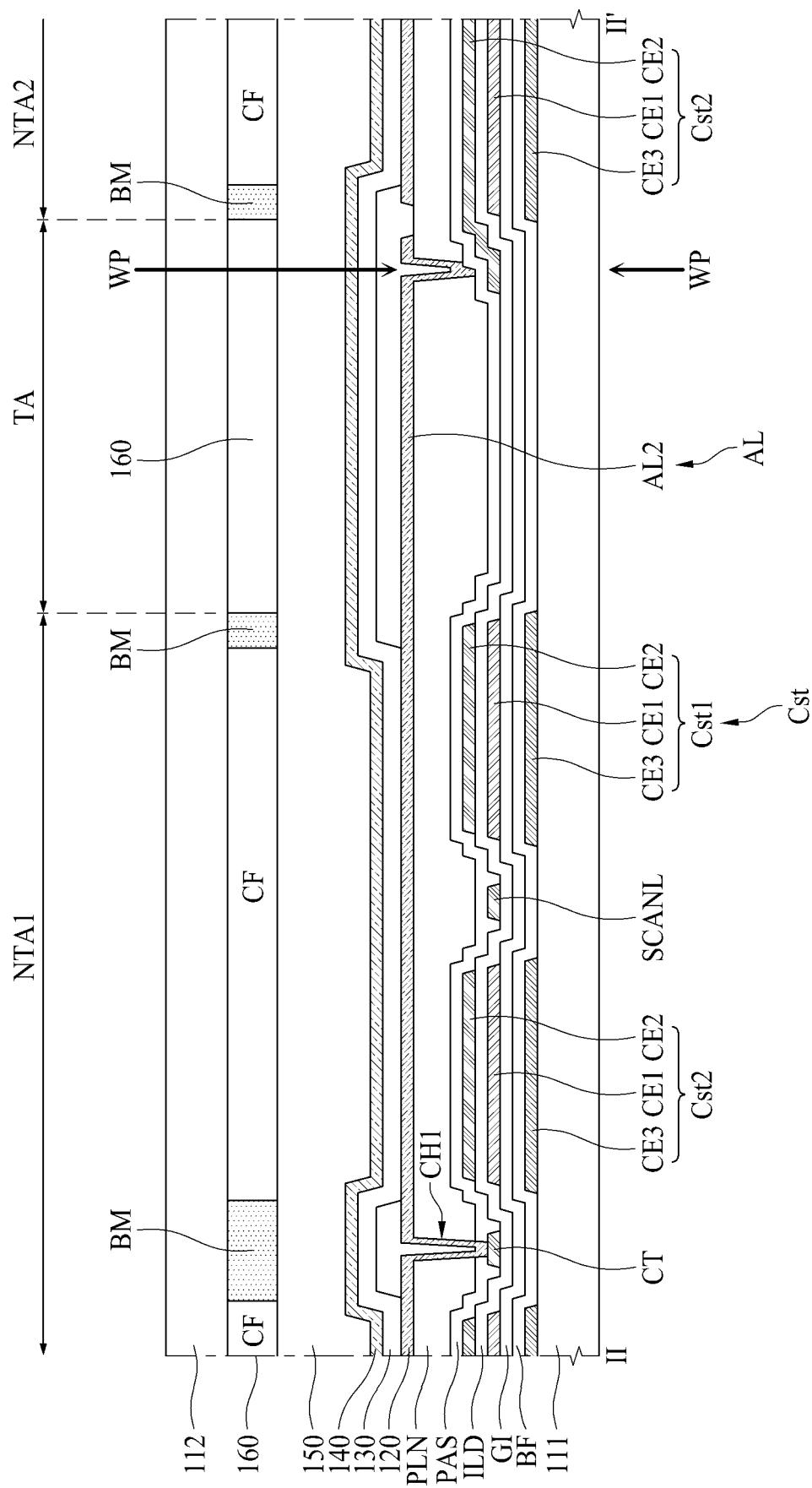
FIG. 8 is a cross-sectional view taken along line II-II' of FIG. 4.
Figure 9:
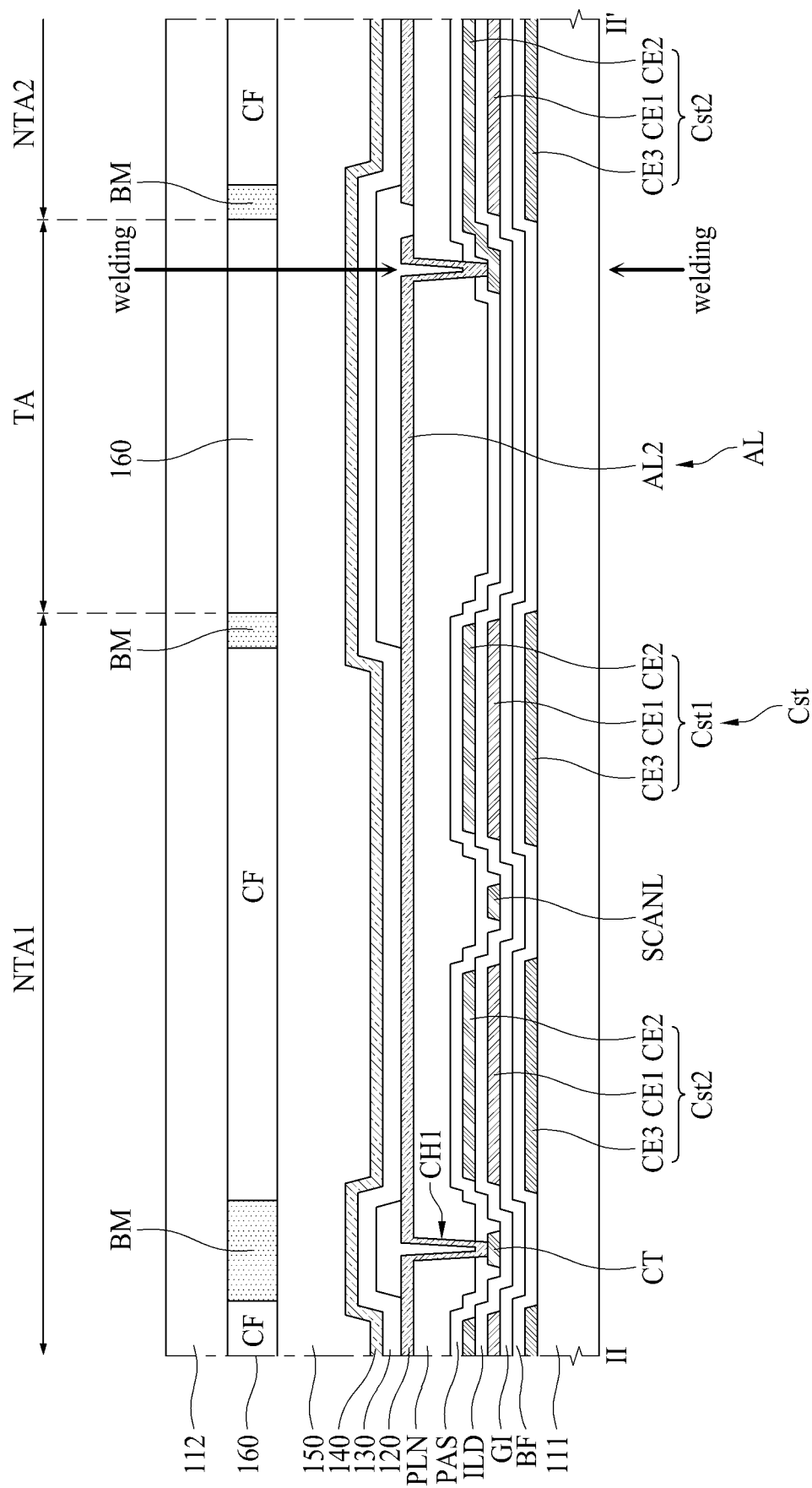
FIG. 9 is a cross-sectional view illustrating a repair process of connecting a defective subpixel with a subpixel disposed to be adjacent thereto.

FIG. 4 is an enlarged view illustrating an area B of FIG. 3. FIG. 5 is an enlarged view illustrating an area C of FIG. 4, FIG. 6 is an enlarged view illustrating an area D of FIG. 4, and FIG. 7 is a cross-sectional view taken along line I-I' of FIG. 4. FIG. 8 is a cross-sectional view taken along line II-II' of FIG. 4, and FIG. 9 is a cross-sectional view illustrating a repair process of connecting a defective subpixel with a subpixel disposed to be adjacent thereto.

Referring to FIGS. 4 to 9, as one example, the first signal line SL1 extended in the first direction (e.g., X-axis direction) may be disposed in the non-transmissive area NTA, and may include, but is not limited to, a scan line SCANL. As another example, the first signal line SL1 may include a plurality of scan lines SCANL, for example, two scan lines SCANL.

For example, the second signal line SL2 extended in the second direction (e.g., Y-axis direction) may be disposed in the non-transmissive area NTA, and may include, but is not limited to, a first data line DL1, a second data line DL2, a pixel power line VDDL, a reference line REFL, a common power line VSSL, a third data line DL3, and a fourth data line DL4. For another example, the second signal line SL2 may only include two data lines, a pixel power line VDDL, a reference line REFL, and a common power line VSSL.

The scan line SCANL may supply a scan signal to the subpixels P1, P2, P3 and P4 provided in the display area DA.

The reference line REFL may supply a reference voltage (or an initialization voltage or a sensing voltage) to the driving transistor DT of each of the subpixels P1, P2, P3 and P4 provided in the display area DA.

Each of the first through fourth data lines DL1, DL2, DL3 and DL4 may supply a data voltage to at least one of the subpixels P1, P2, P3 or P4 provided in the display area DA. For example, the first data line DL1 may supply a first data voltage to a first driving transistor DT1 of the first subpixel P1, the second data line DL2 may supply a second data voltage to a second driving transistor DT2 of the second subpixel P2, the third data line DL3 may supply a third data voltage to a third driving transistor DT3 of the third subpixel P3, and the fourth data line DL4 may supply a fourth data voltage to a fourth driving transistor DT4 of the fourth subpixel P4.

The pixel power line VDDL may supply a first power source to a first electrode 120 of each of the subpixels P1, P2, P3 and P4. The common power line VSSL may supply a second power source to a second electrode 140 of each of the subpixels P1, P2, P3 and P4.

When the second signal line SL2 includes the pixel power line VDDL and the common power line VSSL, since a higher voltage is applied to the pixel power line VDDL and the common power line VSSL than the other signal lines, it is preferable that the pixel power line VDDL and the common power line VSSL have a wider area than the other signal lines. Each of the pixel power line VDDL and the common power line VSSL may be provided as a double layer to make sure of a wide area. For example, the pixel power line VDDL may include a first pixel power line VDDL-1 and a second pixel power line VDDL-2. In addition, the common power line VSSL may include a first common power line VSSL-1 and a second common power line VSSL-2.

The transmissive area TA may be disposed between adjacent first signal lines SL1 and between adjacent second signal lines SL2.

Each of the plurality of subpixels P1, P2, P3 and P4 may be disposed in the non-transmissive area NTA to overlap at least one of the first signal line SL1 or the second signal line SL2. For example, the second subpixel P2 and the fourth subpixel P4 may be provided to overlap at least a portion of the first signal line SL1, and may alternately be disposed along the first signal line SL1. The first subpixel P1 and the third subpixel P3 may be provided to overlap at least a portion of the second signal line SL2, and may alternately be disposed along the second signal line SL2. Each of the plurality of subpixels P1, P2, P3 and P4 may be provided with a light emitting diode.

The driving transistor DT and the capacitor Cst may be disposed between the transmissive area TA and the first signal line SL1 or between the transmissive area TA and the second signal line SL2, and may be connected with the light emitting diode of each of the plurality of subpixels P1, P2, P3 and P4.

The driving transistor DT includes an active layer ACT, a gate electrode GE, a source electrode SE, and a drain electrode DE. The capacitor Cst may include, but is not limited to, a first capacitor electrode CE1, a second capacitor electrode CE2, and a third capacitor electrode CE3. In another embodiment, the capacitor Cst may include only two of the first capacitor electrode CE1, the second capacitor electrode CE2 and the third capacitor electrode CE3.

In detail, the active layer ACT may be provided over the first substrate 111. The active layer ACT may be formed of a silicon based semiconductor material or an oxide based semiconductor material.

A light-shielding layer LS may be provided between the active layer ACT and the first substrate 111. The light-shielding layer LS may serve as a light shielding layer for shielding external light entering the active layer ACT. The light-shielding layer LS may be made of a conductive material. For example, the light-shielding layer LS may be formed of a single layer or a multi-layer made of any one of Mo, Al, Cr, Au, Ti, Ni, Nd and Cu, or their alloy. In this case, a buffer film BF may be provided between the light-shielding layer LS and the active layer ACT.

In addition, the third capacitor electrode CE3 and at least one of the plurality of signal lines may be provided on the same layer as a light-shielding layer LS. For example, the third capacitor electrode CE3, the first data line DL1, the second data line DL2, the first pixel power line VDDL-1, the third data line DL3, and the first common power line VSSL-1 may be formed of the same material as that of the light-shielding layer LS on the same layer as the light-shielding layer LS.

A gate insulating layer GI may be provided over the active layer ACT. The gate insulating layer GI may be formed of an inorganic film, for example, a silicon oxide film (SiOx), a silicon nitride film (SiNx) or a multi-layered film of SiOx and SiNx.

The gate electrode GE may be provided over the gate insulating layer GI. The gate electrode GE may be formed of a single layer or a multi-layer made of any one of Mo, Al, Cr, Au, Ti, Ni, Nd and Cu, or their alloy.

In addition, the first capacitor electrode CE1 and at least one of the plurality of signal lines may be provided on the same layer as the gate electrode GE. For example, the first capacitor electrode CE1, the reference line REFL, and the fourth data line DL4 may be formed of the same material as that of the gate electrode GE on the same layer as the gate electrode GE.

In FIG. 7, the reference line REFL and the fourth data line DL4 are provided on the same layer as the gate electrode GE, and the first data line DL1, the second data line DL2, the first pixel power line VDDL-1, the third data line DL3, and the first common power line VSSL-1 are provided on the same layer as the light-shielding layer LS, but are not limited thereto. Each of the first data line DL1, the second data line DL2, the reference line REFL, the first pixel power line VDDL-1, the first common power line VSSL-1, the third data line DL3, and the fourth data line DL4 may be provided on the same layer as any one of the light-shielding layer LS, the active layer ACT, the gate electrode GE, the source electrode SE, and the drain electrode DE.

In the transparent display panel 110, it is preferable to reduce a size of the non-transmissive area NTA and increase a size of the transmissive area TA in order to make sure of high light transmittance. Therefore, the transparent display panel 110 may improve light transmittance by reducing or minimizing a width of the second signal line SL2 provided in the non-transmissive area NTA.

In the transparent display panel 110 according to one embodiment of the present disclosure, in order to reduce or minimize the width of the second signal line SL2, the plurality of signal lines included in the second signal line SL2 may not be provided in one layer, and may be distributed to the plurality of layers as shown in FIG. 7. Therefore, the transparent display panel 110 according to one embodiment of the present disclosure may reduce or minimize the width of the second signal line SL2 and at the same time reduce or minimize parasitic capacitance between adjacent signal lines.

Meanwhile, in the transparent display panel 110 according to one embodiment of the present disclosure, a signal line disposed at the outermost portion of the plurality of signal lines included in the second signal line SL2 may be provided on the same layer as the light-shielding layer LS. For example, when the first data line DL1 among the plurality of signal lines included in the second signal line SL2 is disposed at the outermost portion, the first data line DL1 may be provided on the same layer as the light-shielding layer LS.

Particles may occur on the upper surface of the signal line during the manufacturing process. When another signal line is deposited on the signal line, in which the particles occur, with one insulating layer interposed therebetween, a short may occur between the signal line in which particles occur and another signal line. Particularly, when a short occurs between the second capacitor electrode CE2 of the capacitor Cst electrically connected with the driving transistor DT and the signal line, a problem may occur in that a subpixel connected with the corresponding driving transistor DT and the capacitor Cst may not emit light.

In the transparent display panel 110 according to one embodiment of the present disclosure, the signal line disposed to be adjacent to the capacitor Cst, especially the second capacitor pattern portion CP2 of the capacitor Cst may be provided in the light-shielding layer LS to prevent a short from occurring between the capacitor Cst and the signal lines due to particles. Since a plurality of insulating layers BF, GI and ILD are provided between the second capacitor electrode CE2 of the capacitor Cst and the light-shielding layer LS, a short may be prevented from occurring between the signal line and the second capacitor electrode CE2 of the capacitor Cst even though particles occur on the upper surface of the signal line provided in the light-shielding layer LS.

In FIG. 4 and FIG. 7, the first data line DL1, the second data line DL2, the reference line REFL, the pixel power line VDDL, the third data line DL3, the fourth data line DL4, and the common power line VSSL are disposed in due order, but are not limited thereto. The arrangement order of the signal lines included in the second signal line SL2 may be changed in various ways.

An inter-layer dielectric layer ILD may be provided over the gate electrode GE. The inter-layer dielectric layer ILD may be made of an inorganic film, for example, a silicon oxide film (SiOx), a silicon nitride film (SiNx) or a multi-layered film of SiOx and SiNx.

The source electrode SE and the drain electrode DE may be provided over the inter-layer dielectric layer ILD. The source electrode SE and the drain electrode DE may be connected to the active layer ACT through a contact hole passing through the gate insulating layer GI and the inter-layer dielectric layer ILD.

The source electrode SE and the drain electrode DE may be made of a single layer or a multi-layer of any one of Mo, Al, Cr, Au, Ti, Ni, Nd and Cu, or their alloy.

In addition, the second capacitor electrode CE2 and at least one of the plurality of signal lines may be provided on the same layer as the source electrode SE and the drain electrode DE. For example, the second capacitor electrode CE2, the second pixel power line VDDL-2, and the second common power line VSSL-2 may be formed of the same material as that of the source electrode SE and the drain electrode DE on the same layer as the source electrode SE and the drain electrode DE.

Particularly, the second capacitor electrode CE2 of the capacitor Cst may be extended from the source electrode SE or the drain electrode DE. Therefore, the second capacitor electrode CE2 of the capacitor Cst may electrically be connected with the source electrode SE or the drain electrode DE of the driving transistor DT.

A passivation layer PAS for protecting the driving transistor DT may be provided over the source electrode SE and the drain electrode DE.

A planarization layer PLN for planarizing a step difference caused by the driving transistor DT may be provided over the passivation layer PAS. The planarization layer PLN may be formed of an organic film such as acryl resin, epoxy resin, phenolic resin, polyamide resin, and polyimide resin.

Hereinafter, an example that the first signal line SL1, the second signal line SL2, the driving transistor DT, and the capacitor Cst are disposed will be described in detail.

As described above, the display area DA includes a transmissive area TA and a non-transmissive area NTA. The transmissive area TA may have a rectangular shape that includes four corners. The transmissive area TA may include a first corner V1, a second corner V2 facing the first corner V1 in the second direction, a third corner V3 facing the second corner V2 in the first direction, and a fourth corner V4 facing the first corner V1 in the first direction.

The non-transmissive area NTA includes a first non-transmissive area NTA1 extended between adjacent transmissive areas TA in the first direction (e.g., X-axis direction), and a second non-transmissive area NTA2 extended between adjacent transmissive areas TA in the second direction (e.g., Y-axis direction).

The first signal line SL1, the first capacitor pattern portion CP1 of the capacitor Cst and the driving transistor DT of each of the subpixels P1, P2, P3 and P4 may be disposed in the first non-transmissive area NTA1. The second signal line SL2 and the second capacitor pattern portion CP2 of the capacitor Cst of each of the subpixels P1, P2, P3 and P4 may be disposed in the second non-transmissive area NTA2.

The transparent display panel 110 according to one embodiment of the present disclosure includes a capacitor Cst having an L-shape. In detail, the capacitor Cst includes a first capacitor pattern portion CP1 and a second capacitor pattern portion CP2. The first capacitor pattern portion CP1 may be disposed between the first signal line SL1 and the transmissive area TA in the first non-transmissive area NTA1 and longitudinally provided in the first direction (e.g., X-axis direction). When the first signal line SL1 includes one scan line SCANL, the first capacitor pattern portion CP1 may be disposed between the scan line SCANL and the transmissive area TA.

The second capacitor pattern portion CP2 may be extended from one end of the first capacitor pattern portion CP1. The second capacitor pattern portion CP2 may be disposed between the second signal line SL2 and the transmissive area TA in the second non-transmissive area NTA2 and longitudinally provided in the second direction (e.g., Y-axis direction). When the second signal line SL2 includes a plurality of signal lines, the second capacitor pattern portion CP2 may be disposed between the signal line disposed at the outermost portion of the plurality of signal lines and the transmissive area TA.

The second capacitor pattern CP2 may have a width W2 smaller than a width W1 of the first capacitor pattern CP1. The first capacitor pattern portion CP1 may be provided along the first signal line SL1 in the first non-transmissive area NTA1, and the second capacitor pattern portion CP2 may be provided along the second signal line SL2 in the second non-transmissive area NTA2. At this time, the first signal line SL1 includes only the scan line SCANL, but the second signal line SL2 may include a large number of signal lines such as a first data line DL1, a second data line DL2, a pixel power line VDDL, a reference line REFL, a common power line VSSL, a third data line DL3, and a fourth data line DL4. Therefore, the width of the second signal line SL2 becomes greater than the width of the first signal line SL1.

In the transparent display panel 110 according to one embodiment of the present disclosure, the width W2 of the second capacitor pattern portion CP2 is smaller than the width W1 of the first capacitor pattern portion CP1, whereby the first non-transmissive area NTA1 and the second non-transmissive area NTA2 may be formed to be similar to each other by reducing a width difference therebetween.

In the transparent display panel 110 according to one embodiment of the present disclosure, the second and fourth subpixels P2 and P4 provided along the first non-transmissive area NTA1 and the first and third subpixels P1 and P3 provided along the second non-transmissive area NTA2 may be formed to have similar light emission areas. Therefore, in the transparent display panel 110 according to one embodiment of the present disclosure, a difference between a horizontal length and a vertical length of the transmissive area TA may be reduced, and preferably, the transmissive area TA may be embodied in a square shape. The square shape has the shortest circumferential length among the squares having the same area. When the transmissive area TA is embodied in a square shape, the circumferential length of the transmissive area TA may be reduced or minimized. As described above, the transparent display panel 110 may include a black matrix BM between the subpixels P1, P2 and P4 and the transmissive area TA, and light transmittance is reduced as an area for forming the black matrix BM is increased.

In the transparent display panel 110 according to one embodiment of the present disclosure, the transmissive area TA is formed in a square shape, whereby the area for forming the black matrix BM may be reduced or minimized. Therefore, the transparent display panel 110 according to one embodiment of the present disclosure may improve light transmittance.

In addition, in the transparent display panel 110 according to one embodiment of the present disclosure, the transmissive area TA is formed in a square shape, whereby a diffraction phenomenon may be prevented from occurring in light passing through the transmissive area TA.

According to the diffraction phenomenon, light corresponding to plane waves may be changed to spherical waves as the light passes through the slit and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced.

This diffraction phenomenon may occur when the external light passes through the slit, elongated linear or rectangular transmissive area TA. The transparent display panel 110 according to one embodiment of the present disclosure may form the transmissive area TA in a square shape, thereby preventing a diffraction phenomenon from occurring, and improving definition of image quality.

Meanwhile, the capacitor Cst including the first capacitor pattern portion CP1 and the second capacitor pattern portion CP2 and the driving transistor DT may be provided for each of the subpixels P1, P2, P3 and P4.

The capacitor Cst may include a first capacitor Cst1 connected with the first subpixel P1, a second capacitor Cst2 connected with the second subpixel P2, a third capacitor Cst3 connected with the third subpixel P3, and a fourth capacitor Cst4 connected with the fourth subpixel P4.

In addition, the driving transistor DT may include a first driving transistor DT1 connected with the first subpixel P1, a second driving transistor DT2 connected with the second subpixel P2, a third driving transistor DT3 connected with the third subpixel P3, and a fourth driving transistor DT4 connected with the fourth subpixel P4.

The first capacitor Cst1 may be disposed to correspond to the first corner V1 of each of the plurality of transmissive areas TA, and may be formed in an L-shape along an outer portion of the transmissive area TA. In detail, the first capacitor pattern portion CP1 of the first capacitor Cst1 may be disposed between the first signal line SL1 and the transmissive area TA at a first side of the first signal line SL1. The first capacitor pattern portion CP1 of the first capacitor Cst1 may be provided along the outer portion from the first corner V1 of the transmissive area TA toward the fourth corner V4.

The second capacitor pattern portion CP2 of the first capacitor Cst1 may be disposed between the second signal line SL2 and the transmissive area TA at the first side of the first signal line SL1. The second capacitor pattern portion CP2 of the first capacitor Cst1 may be bent at one end of the first capacitor pattern portion CP1, and may be provided along the outer portion from the first corner V1 of the transmissive area TA toward the second corner V2.

The first capacitor Cst1 may be connected with the first electrode 120 of the first subpixel P1 in the second capacitor pattern portion CP2.

Meanwhile, the first driving transistor DT1 may be spaced apart from the second signal line SL2 in the first non-transmissive area NTA1 with the first capacitor Cst1 interposed therebetween. Therefore, the first driving transistor DT1 connected with the first subpixel P1 may be spaced apart from the first subpixel P1 with the first capacitor Cst1 interposed therebetween, and may overlap at least one of the second subpixel P2 and the fourth subpixel P4. For example, the first driving transistor DT1 may overlap at least a portion of the second subpixel P2.

The first driving transistor DT1 may be disposed between the first signal line SL1 and the transmissive area TA and thus connected with the other end of the first capacitor pattern portion CP1 of the first capacitor Cst1. The gate electrode GE of the first driving transistor DT1 may be provided to be extended from the first capacitor electrode CE1 provided in the first capacitor pattern portion CP1 of the first capacitor Cst1. The source electrode SE or the drain electrode DE of the first driving transistor DT1 may be provided to be extended from the second capacitor electrode CE2 of the first capacitor pattern portion CP1 of the first capacitor Cst1. The first driving transistor DT1 may electrically be connected with the first electrode 120 of the first subpixel P1 through the first capacitor Cst1.

The second capacitor Cst2 may be disposed to correspond to the second corner V2 of each of the plurality of transmissive areas TA, and may be formed to be symmetrical with the first capacitor Cst1. In detail, the first capacitor pattern portion CP1 of the second capacitor Cst2 may be disposed between the first signal line SL1 and the transmissive area TA at a second side of the first signal line SL1. The first capacitor pattern portion CP1 of the second capacitor Cst2 may be provided along the outer portion from the second corner V2 of the transmissive area TA toward the third corner V3. At this time, the first capacitor pattern portion CP1 of the second capacitor Cst2 may be provided to be symmetrical with the first capacitor pattern portion CP1 of the first capacitor Cst1 based on the first signal line SL1.

The second capacitor pattern portion CP2 of the second capacitor Cst2 may be disposed between the second signal line SL2 and the transmissive area TA at the second side of the first signal line SL1. The second capacitor pattern portion CP2 of the second capacitor Cst2 may be bent at one end of the first capacitor pattern portion CP1, and may be provided along the outer portion from the second corner V2 of the transmissive area TA toward the first corner V1.

The second capacitor Cst2 may be connected with the first electrode 120 of the second subpixel P2 in the first capacitor pattern portion CP1.

Meanwhile, the second driving transistor DT2 may be spaced apart from the second signal line SL2 in the first non-transmissive area NTA1 with the second capacitor Cst2 interposed therebetween. The second driving transistor DT2 connected with the second subpixel P2 may at least partially overlap the second subpixel P2.

The second driving transistor DT2 may be disposed to be symmetrical with the first driving transistor DT1 based on the first signal line SL1, and may be connected with the other end of the first capacitor pattern portion CP1 of the second capacitor Cst2. The gate electrode GE of the second driving transistor DT2 may be provided to be extended from the first capacitor electrode CE1 provided in the first capacitor pattern portion CP1 of the second capacitor Cst2. The source electrode SE or the drain electrode DE of the second driving transistor DT2 may be provided to be extended from the second capacitor electrode CE2 provided in the first capacitor pattern portion CP1 of the second capacitor Cst2. The second driving transistor DT2 may electrically be connected with the first electrode 120 of the second subpixel P2 through the second capacitor Cst2 and a contact electrode CT.

The third capacitor Cst3 may be disposed to correspond to the third corner V3 of each of the plurality of transmissive areas TA, and may be formed to be symmetrical with the second capacitor Cst2. In detail, the first capacitor pattern portion CP1 of the third capacitor Cst3 may be disposed between the first signal line SL1 and the transmissive area TA at the second side of the first signal line SL1. The first capacitor pattern portion CP1 of the third capacitor Cst3 may be provided along the outer portion from the third corner V3 of the transmissive area TA toward the second corner V2. At this time, the first capacitor pattern portion CP1 of the third capacitor Cst3 may be provided to be symmetrical with the first capacitor pattern portion CP1 of the second capacitor Cst2 based on the second signal line SL2.

The second capacitor pattern portion CP2 of the third capacitor Cst3 may be disposed between the second signal line SL2 and the transmissive area TA at the second side of the first signal line SL1. The second capacitor pattern portion CP2 of the third capacitor Cst3 may be bent at one end of the first capacitor pattern portion CP1, and may be provided along the outer portion from the third corner V3 of the transmissive area TA toward the fourth corner V4.

The third capacitor Cst3 may be connected with the first electrode 120 of the third subpixel P3 in the second capacitor pattern portion CP2.

Meanwhile, the third driving transistor DT3 may be spaced apart from the second signal line SL2 in the first non-transmissive area NTA1 with the third capacitor Cst3 interposed therebetween. Therefore, the third driving transistor DT3 connected with the third subpixel P3 may be spaced apart from the third subpixel P3 with the third capacitor Cst3 interposed therebetween, and may overlap at least one of the second subpixel P2 or the fourth subpixel P4. For example, the third driving transistor DT3 may at least partially overlap the fourth subpixel P4.

The third driving transistor DT3 may be disposed to be symmetrical with the second driving transistor DT2 based on the second signal line SL2, and may be connected with the other end of the first capacitor pattern portion CP1 of the third capacitor Cst3. The gate electrode GE of the third driving transistor DT3 may be provided to be extended from the first capacitor electrode CE1 provided in the first capacitor pattern portion CP1 of the third capacitor Cst3. The source electrode SE or the drain electrode DE of the third driving transistor DT3 may be provided to be extended from the second capacitor electrode CE2 provided in the first capacitor pattern portion CP1 of the third capacitor Cst3. The third driving transistor DT3 may electrically be connected with the first electrode 120 of the third subpixel P3 through the third capacitor Cst3.

The fourth capacitor Cst4 may be disposed to correspond to the fourth corner V4 of each of the plurality of transmissive areas TA, and may be formed to be symmetrical with the third capacitor Cst3. In detail, the first capacitor pattern portion CP1 of the fourth capacitor Cst4 may be disposed between the first signal line SL1 and the transmissive area TA at the first side of the first signal line SL1. The first capacitor pattern portion CP1 of the fourth capacitor Cst4 may be provided along the outer portion from the fourth corner V4 of the transmissive area TA toward the first corner V1. At this time, the first capacitor pattern portion CP1 of the fourth capacitor Cst4 may be provided to be symmetrical with the first capacitor pattern portion CP1 of the third capacitor Cst3 based on the first signal line SL1.

The second capacitor pattern portion CP2 of the fourth capacitor Cst4 may be disposed between the second signal line SL2 and the transmissive area TA at the first side of the first signal line SL1. The second capacitor pattern portion CP2 of the fourth capacitor Cst4 may be bent at one end of the first capacitor pattern portion CP1, and may be provided along the outer portion from the fourth corner V4 of the transmissive area TA toward the third corner V3.

The fourth capacitor Cst4 may be connected with the first electrode 120 of the fourth subpixel P4 in the first capacitor pattern portion CP1.

Meanwhile, the fourth driving transistor DT4 may be spaced apart from the second signal line SL2 in the first non-transmissive area NTA1 with the fourth capacitor Cst4 interposed therebetween. The fourth driving transistor DT4 connected with the fourth subpixel P4 may overlap at least partially the fourth subpixel P4.

The fourth driving transistor DT4 may be disposed to be symmetrical with the third driving transistor DT3 based on the first signal line SL1, and may be connected with the other end of the first capacitor pattern portion CP1 of the fourth capacitor Cst4. The gate electrode GE of the fourth driving transistor DT4 may be provided to be extended from the first capacitor electrode CE1 provided in the first capacitor pattern portion CP1 of the fourth capacitor Cst4. The source electrode SE or the drain electrode DE of the fourth driving transistor DT4 may be provided to be extended from the second capacitor electrode CE2 provided in the first capacitor pattern portion CP1 of the fourth capacitor Cst4. The fourth driving transistor DT4 may electrically be connected with the first electrode 120 of the fourth subpixel P4 through the fourth capacitor Cst4 and contact electrode CT.

Referring back to FIG. 7, light emitting diodes including the first electrode 120, the organic light emitting layer 130 and the second electrode 140, and a bank 125 are provided over a planarization layer PLN.

The first electrode 120 may be provided over a planarization layer PLN and connected with the driving transistor DT. The first electrode 120 may be provided for each of the subpixels P1, P2, P3 and P4. One first electrode 120 may be provided in the first subpixel P1, another first electrode 120 may be provided in the second subpixel P2, the other first electrode 120 may be provide in the third subpixel P3, and the other first electrode 120 may be provided in the fourth subpixel P4. The first electrode 120 is not provided in the transmissive area TA.

The first electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti). The first electrode 120 may be anode electrode.

The first electrode 120 may electrically be connected with the source electrode SE or the drain electrode DE of the driving transistor DT through a second capacitor electrode CE2 of a capacitor Cst.

In detail, a portion of the plurality of subpixels P1, P2, P3 and P4 may electrically be connected with the source electrode SE or the drain electrode DE of the driving transistor DT through the second capacitor electrode CE2 provided in a first capacitor pattern portion CP1 of the capacitor Cst.

A portion of the plurality of capacitors Cst may include a first concave portion CC1 in the first capacitor pattern portion CP1 as shown in FIGS. 4 and 5. For example, the first capacitor pattern portion CP1 of the second capacitor Cst2 connected with the second subpixel P2 may include a first concave portion CC1 that at least partially overlaps the first electrode 120 of the second subpixel P2 and forms a concave area in a direction from the transmissive area TA toward the first signal line SL1. Also, the first capacitor pattern portion CP1 of the fourth capacitor Cst4 connected with the fourth subpixel P4 may include a first concave portion CC1 that at least partially overlaps the first electrode 120 of the fourth subpixel P4 and forms a concave area in a direction from the transmissive area TA toward the first signal line SL1. In this case, as shown in FIGS. 4 and 5, the first electrode 120 may include an opening area OA that at least partially overlaps the concave area of the first capacitor pattern portion CP1 of each of the second capacitor Cst2 and the fourth capacitor Cst4.

Meanwhile, the contact electrode CT may be provided to be protruded from the first concave portion CC1 of the first capacitor pattern portion CP1 toward the transmissive area TA. At this time, the contact electrode CT may be protruded from the second capacitor electrode CE2 provided in the first capacitor pattern portion CP1. The contact electrode CT may at least partially overlap the first electrode 120 at an end, and the other portion thereof may be exposed by the opening area OA provided in the first electrode 120.

The first electrode 120 of some subpixels, for example, the second subpixel P2 and the fourth subpixel P4, may be connected to the contact electrode CT through a first contact hole CH1 in an area overlapped with the contact electrode CT. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the contact electrode CT and the second capacitor electrode CE2 of the capacitor Cst.

The first electrode 120 of the other portion of the plurality of subpixels P1, P2, P3 and P4 may electrically be connected with the source electrode SE or the drain electrode DE of the driving transistor DT through the second capacitor electrode CE2 provided in a second capacitor pattern portion CP2 of the capacitor Cst. For example, the second capacitor pattern portion CP2 of the first capacitor Cst1 connected with the first subpixel P1 may at least partially overlap the first electrode 120 of the first subpixel P1. Also, the second capacitor pattern portion CP2 of the third capacitor Cst3 connected with the third subpixel P3 may at least partially overlap the first electrode 120 of the third subpixel P3.

The first electrode 120 of some subpixels, for example, the first subpixel P1 and the third subpixel P3, may be connected with the second capacitor electrode CE2 of the second capacitor pattern portion CP2 through a second contact hole CH2 in an area overlapped with the second capacitor pattern portion CP2. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the second capacitor electrode CE2 of the capacitor Cst.

In the transparent display panel 110 according to one embodiment of the present disclosure described as above, a defect may occur in the driving transistor DT. When a defect occurs in the driving transistor DT, the driving transistor DT and the first electrode 120 of the corresponding subpixel may electrically be separated from each other. That is, the first electrode 120 of the subpixel having a defect is not connected with the driving transistor DT.

In detail, the first electrode 120 of some subpixels, for example, the second subpixel P2 and the fourth subpixel P4, may be connected with the driving transistor DT through the contact electrode CT extended from the first capacitor pattern portion CP1 of the capacitor Cst. As shown in FIG. 5, the contact electrode CT may include a first cutting area C1 between the first contact hole CH1 and the first capacitor pattern portion CP1.

When a defect occurs in the driving transistor DT of the subpixel, the first cutting area C1 of the contact electrode CT connected with the first electrode 120 of the corresponding subpixel may be cut by a laser, so that the driving transistor DT having a defect and the first electrode 120 may electrically be separated from each other. Therefore, a signal applied from the driving transistor DT is blocked from being applied to the subpixel in which a defect occurs in the driving transistor DT, whereby the subpixel may not emit light.

Meanwhile, the first electrode 120 of some subpixels, for example, the first subpixel P1 and the third subpixel P3, may be connected with the driving transistor DT through the second capacitor pattern portion CP2 of the capacitor Cst. At this time, as shown in FIG. 6, the first electrode 120 may be provided with a second concave portion CC2 that forms a concave area in a direction from the transmissive area TA toward the second signal line SL2 to expose a portion of the second capacitor pattern portion CP2. The second capacitor pattern portion CP2 may include a second cutting area C2 exposed by the second concave portion CC2 of the first electrode 120.

When a defect occurs in the driving transistor DT of the subpixel, the second cutting area C2 of the second capacitor pattern portion CP2 connected with the first electrode 120 of the corresponding subpixel may be cut by a laser, so that the driving transistor DT having a defect and the first electrode 120 may electrically be separated from each other. Therefore, a signal applied from the driving transistor DT is blocked from being applied to the subpixel in which a defect occurs in the driving transistor DT, whereby the subpixel may not emit light.

In the transparent display panel 110 according to one embodiment of the present disclosure, a signal of a subpixel, which has the same color as that of a defective subpixel and is adjacent to the defective subpixel, may be applied to the defective subpixel through the anode line AL.

In detail, in the transparent display panel 110 according to one embodiment of the present disclosure, the anode line AL may be provided over at least one side of the transmissive area TA. The anode line AL may be extended from the first electrode 120 of each of the plurality of subpixels P1, P2, P3 and P4 and at least a portion thereof may overlap the driving transistor DT or the capacitor Cst of another adjacent subpixel having the same color. The anode line AL may include a first anode line AL1, a second anode line AL2, a third anode line AL3, and a fourth anode line AL4.

The first anode line AL1 may be provided between two first subpixels P1 facing each other with the transmissive area TA interposed therebetween. The first anode line AL1 may be protruded from the first electrode 120 of one of the two first subpixels P1 that face each other with the transmissive area TA interposed therebetween, and may be extended toward the other first subpixel P1.

The first subpixels P1 may be disposed to face each other in the first direction with the transmissive area TA interposed therebetween. In this case, the first anode line AL1 may be extended from the first electrode 120 of each of the first subpixels P1 in the first direction, and at least a portion thereof may overlap the first driving transistor DT1 or the first capacitor Cst1 of the first subpixel P1 adjacent thereto in the first direction.

For example, the first anode line AL1 may be protruded from the first electrode 120 of each of the first subpixels P1 and extended in the first direction along the first side of the transmissive area TA. The first driving transistor DT1 may be disposed at the other end of the first capacitor pattern portion CP1 of the first capacitor Cst1. The source electrode SE or the drain electrode DE of the first driving transistor DT1 may be provided with a protrusion portion PP protruded toward the transmissive area TA to contact the first anode line AL1. Therefore, at least a portion of the first anode line AL1 may overlap the source electrode SE or the drain electrode DE of the first driving transistor DT1 of the first subpixel P1 adjacent thereto in the first direction, whereby the first welding point WP1 may be provided.

The second anode line AL2 may be provided between two second subpixels P2 facing each other with the transmissive area TA interposed therebetween. The second anode line AL2 may be protruded from the first electrode 120 of one of the two second subpixels P2 facing each other with the transmissive area TA interposed therebetween, and may be extended toward the other second subpixel P2.

The second subpixels P2 may be disposed to face each other in a second direction with the transmissive area TA interposed therebetween. In this case, the second anode line AL2 may be extended from the first electrode 120 of each of the second subpixels P2 in the second direction, and at least a portion thereof may overlap the second driving transistor DT2 or the second capacitor Cst2 of the second subpixel P2 adjacent thereto in the second direction.

For example, the second anode line AL2 may be protruded from the first electrode 120 of each of the second subpixels P2 and extended in the second direction along the third side connecting the first side with the second side of the transmissive area TA. The first capacitor pattern portion CP1 of the second capacitor Cst2 may be disposed between the first signal line SL1 and the transmissive area TA at the second side of the first signal line SL1, and the second capacitor Cst2 may be bent at one end of the first capacitor pattern portion CP1, whereby the second capacitor pattern portion CP2 may be disposed between the second signal line SL2 and the transmissive area TA. The second capacitor electrode CE2 of the second capacitor pattern portion CP2 may be provided with a protrusion portion PP protruded toward the transmissive area TA to contact the second anode line AL2. Therefore, at least a portion of the second anode line AL2 may overlap the second capacitor pattern portion CP2 of the second capacitor Cst2 of the second subpixel P2 adjacent thereto in the second direction, more specifically the second capacitor electrode CE2 of the second capacitor pattern portion CP2, whereby the second welding point WP2 may be provided.

The third anode line AL3 may be provided between two third subpixels P3 facing each other with the transmissive area TA interposed therebetween. The third anode line AL3 may be protruded from the first electrode 120 of one of the two third subpixels P3 facing each other with the transmissive area TA interposed therebetween, and may be extended toward the other third subpixel P3.

The third subpixels P3 may be disposed to face each other in the first direction with the transmissive area TA interposed therebetween. In this case, the third anode line AL3 may be extended from the first electrode 120 of each of the third subpixels P3 in the first direction to at least partially overlap a third driving transistor DT3 or the third capacitor Cst3 of the third subpixel P3 adjacent thereto in the first direction.

For example, the third anode line AL3 may be protruded from the first electrode 120 of each of the third subpixels P3 and extended in the first direction along the second side facing the first side of the transmissive area TA. The third driving transistor DT3 may be disposed at the other end of the first capacitor pattern portion CP1 of the third capacitor Cst3. The source electrode SE or the drain electrode DE of the third driving transistor DT3 may be provided with a protrusion portion PP protruded toward the transmissive area TA to contact the third anode line AL3. Therefore, at least a portion of the third anode line AL3 may overlap the source electrode SE or the drain electrode DE of the third driving transistor DT3 of the third subpixel P3 adjacent thereto in the first direction, whereby the third welding point WP3 may be provided.

The fourth anode line AL4 may be provided between two fourth subpixels P4 facing each other with the transmissive area TA interposed therebetween. The fourth anode line AL4 may be protruded from the first electrode 120 of one of the two fourth subpixels P4 facing each other with the transmissive area TA interposed therebetween, and may be extended toward the other fourth subpixel P4.

The fourth subpixels P4 may be disposed to face each other in the second direction with the transmissive area TA interposed therebetween. In this case, the fourth anode line AL4 may be extended from the first electrode 120 of each of the fourth subpixels P4 in the second direction, and at least a portion thereof may overlap the fourth driving transistor DT4 or the fourth capacitor Cst4 of the fourth subpixel P4 adjacent thereto in the second direction.

For example, the fourth anode line AL4 may be protruded from the first electrode 120 of each of the fourth subpixels P4 and extended in the second direction along the fourth side facing the third side of the transmissive area TA. The first capacitor pattern portion CP1 of fourth capacitor Cst4 may be disposed between the first signal line SL1 and the transmissive area TA at the first side of the first signal line SL1, and the fourth capacitor Cst4 may be bent at one end of the first capacitor pattern portion CP1, whereby the second capacitor pattern portion CP2 may be disposed between the second signal line SL2 and the transmissive area TA. The second capacitor electrode CE2 of the second capacitor pattern portion CP2 may be provided with a protrusion portion PP protruded toward the transmissive area TA to contact the fourth anode line AL4. Therefore, at least a portion of the fourth anode line AL4 may overlap the second capacitor pattern portion CP2 of the fourth capacitor Cst4 of the fourth subpixel P4 adjacent thereto in the second direction, more specifically the second capacitor electrode CE2 of the second capacitor pattern portion CP2, whereby the fourth welding point WP4 may be provided.

Each of the first to fourth anode lines AL1, AL2, AL3 and AL4 disposed as above may be connected with the first electrode 120 of the subpixel at one end. Each of the first to fourth anode lines AL1, AL2, AL3 and AL4 may electrically be separated from the driving transistors DT1, DT2, DT3 and DT4 or the capacitors Cst1, Cst2, Cst3 and Cst4 at the welding points WP1, WP2, WP3 and WP4 provided at the other end with at least one insulating layer, for example, a planarization layer PLN and a passivation layer PAS, which are interposed therebetween.

The first through fourth anode lines AL1, AL2, AL3 and AL4 may be formed to be flat on the planarization layer PLN, but as shown in FIG. 8, may have a step difference along a hole provided in the planarization layer PLN at the welding points WP1, WP2, WP3 and WP4. In detail, since a thickness of the planarization layer PLN is relatively thick, the planarization layer PLN may partially be removed at a position corresponding to the welding points WP1, WP2, WP3, and WP4 to form a hole. Therefore, the first to fourth anode lines AL1, AL2, AL3 and AL4 may be spaced apart from the driving transistors DT1, DT2, DT3 and DT4 or the capacitors Cst1, Cst2, Cst3 and Cst4 at the welding points WP1, WP2, WP3 and WP4 with only the passivation layer PAS interposed therebetween.

Therefore, the signal applied to one subpixel may not be applied to the other subpixel adjacent thereto until the repair process is performed. However, when a defect occurs in the driving transistor of one subpixel, the repair process of connecting the subpixel having a defect with a normal subpixel may be performed.

The repair process may include a test process, a cutting process, and a welding process. The test process may detect whether the plurality of subpixels P1, P2, P3 and P4 are defective. The cutting process may cut the area where the subpixel and the driving transistor DT are connected with each other, to block the signal applied from the driving transistor DT from being applied to the subpixel that is determined to be defective. The welding process may electrically connect the normal subpixel adjacent to the defective subpixel with the defective subpixel to apply a signal of the normal subpixel to the defective subpixel.

In more detail, when a defect occurs in the first driving transistor DT1 of one first subpixel P1, the repair process of connecting the first subpixel P1 having a defect with the first subpixel P1 of a normal state may be performed.

The repair process may block a signal applied from the first driving transistor DT1 from being applied to the first subpixel P1 that is determined to be defective, by cutting the second cutting area C2 of the second capacitor pattern portion CP2 of the first capacitor Cst1 through the cutting process.

The repair process may apply a signal of the normal first subpixel P1, which is adjacent to the defective subpixel, to the defective first subpixel P1 by electrically connecting the normal first subpixel P1 with the defective first subpixel P1 through the welding process. In detail, the welding process may irradiate a laser to the first anode line AL1 of the defective first subpixel P1 and the first capacitor Cst1 of the normal first subpixel P1, specifically the first welding point WP1 overlapped with at least portion of the second capacitor electrode CE2 of the second capacitor pattern portion CP2. Therefore, the first anode line AL1 of the defective first subpixel P1 and the first capacitor Cst1 of the normal first subpixel P1, which are electrically separated from each other, may electrically be connected with each other as shown in FIG. 9.

At this time, the welding process may irradiate a laser to a lower or upper portion of the first anode line AL1. The welding process may be performed before the light emitting layer 130 or the second electrode 140 is deposited. In this case, the laser may be irradiated above the first anode line AL1, whereby the first anode line AL1 of the defective first subpixel P1 and the first capacitor Cst1 of the normal first subpixel P1, which are electrically separated from each other, may electrically be connected with each other. Alternatively, the welding process may be performed after the light emitting layer 130 or the second electrode 140 is deposited, and in this case, the laser may be irradiated to the lower portion of the first anode line AL1, whereby the first anode line AL1 of the defective first subpixel P1 and the first capacitor Cst1 of the normal first subpixel P1, which are electrically separated from each other, may electrically be connected with each other.

Since the first capacitor Cst1 is electrically connected with the first driving transistor DT1, the signal applied to the first driving transistor DT1 of the first subpixel P1 may be applied to the first electrode 120 of the defective first subpixel P1 through the first capacitor Cst1 and the first anode line AL1.

When a defect occurs in the second driving transistor DT2 of one second subpixel P2, the repair process of connecting the defective second subpixel P2 with the normal second subpixel P2 may be performed.

The repair process may block a signal applied from the second driving transistor DT2 from being applied to the second subpixel P2 that is determined to be defective, by cutting the first cutting area C1 of the contact electrode CT extended from the first capacitor pattern portion CP1 of the second capacitor Cst2 through the cutting process.

The repair process may apply the signal of the normal second subpixel P2, which is adjacent to the defective second subpixel P2, to the defective second subpixel P2 by electrically connecting the normal second subpixel P2 with the defective second subpixel P2 through the welding process. In detail, the welding process may irradiate the laser to the second anode line AL2 of the defective second subpixel P2 and the second driving transistor DT2 of the normal second subpixel P2, specifically the second welding point WP2 overlapped with at least portion of the source electrode SE or the drain electrode DE. Therefore, the second anode line AL2 of the defective second subpixel P2 and the second driving transistor DT2 of the normal second subpixel P2, which are electrically separated from each other, may electrically be connected with each other.

At this time, the welding process may irradiate a laser to a lower or upper portion of the second anode line AL2. The welding process may be performed before the light emitting layer 130 or the second electrode 140 is deposited, and in this case, the laser may be irradiated from the upper portion of the second anode line AL2, whereby the second anode line AL2 of the defective second subpixel P2 and the second driving transistor DT2 of the normal second subpixel P2, which are electrically separated from each other, may electrically be connected with each other. Alternatively, the welding process may be performed after the light emitting layer 130 or the second electrode 140 is deposited, and in this case, the laser may be irradiated to the lower portion of the second anode line AL2, whereby the second anode line AL2 of the defective second subpixel P2 and the second driving transistor DT2 of the normal second subpixel P2, which are electrically separated from each other, may electrically be connected with each other.

Therefore, the signal applied to the second driving transistor DT2 of the normal second subpixel P2 may be applied to the first electrode 120 of the defective second subpixel P2 through the second anode line AL2.

Meanwhile, when a defect occurs in the third driving transistor DT3 of the third subpixel P3, the repair process of connecting the defective third subpixel P3 with the normal third subpixel P3 may be performed. Since the repair process for the third subpixel P3 is substantially the same as the repair process for the first subpixel P1, its detailed description will be omitted.

In addition, when a defect occurs in the fourth driving transistor DT4 of the fourth subpixel P4, the repair process of connecting the defective fourth subpixel P4 with the normal fourth subpixel P4 may be performed. Since the repair process for the fourth subpixel P4 is substantially the same as the repair process for the second subpixel P2, its detailed description will be omitted.

The bank 125 may be provided over the planarization layer PLN. In addition, the bank 125 may be provided between the first electrodes 120. The bank 125 may be provided to cover or at least partially cover edges of each of the first electrodes 120 and expose a portion of each of the first electrodes 120. Therefore, the bank 125 may prevent light emission efficiency from being deteriorated by a current concentrated on each end of the first electrodes 120.

The bank 125 may define the light emission areas EA1, EA2, EA3 and EA4 of each of the subpixels P1, P2, P3 and P4. The light emission areas EA1, EA2, EA3 and EA4 of each of the subpixels P1, P2, P3 and P4 refer to areas in which the first electrode 120, the organic light emitting layer 130, and the second electrode 140 are sequentially deposited so that holes from the first electrode 120 and electrons from the second electrode 140 are combined with each other in the organic light emitting layer 130 to emit light. In this case, since the area in which the bank 125 is provided does not emit light, the area may be a non-light emission area, and the area in which the bank 125 is not provided and the first electrode 120 is exposed may be the light emission areas EA1, EA2, EA3 and EA4.

The bank 125 may be formed of an organic layer, for example, acryl resin, epoxy resin, phenolic resin, polyamide resin, polyimide resin, etc.

The organic light emitting layer 130 may be provided over the first electrode 120. The organic light emitting layer 130 may include a hole transporting layer, a light emitting layer, and an electron transporting layer. In this case, if a voltage is applied to the first electrode 120 and the second electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided for the subpixels P1, P2, P3 and P4. For example, the organic light emitting layer 130 may be a white light emitting layer emitting white light.

In another embodiment, the organic light emitting layer 130 may include light emitting layers provided per subpixels P1, P2, P3 and P4. For example, a green light emitting layer emitting green light may be provided in the first subpixel P1, a red light emitting layer emitting red light may be provided in the second subpixel P2, a white light emitting layer emitting white light may be provided in the third subpixel P3, and a blue light emitting layer emitting blue light may be provided in the fourth subpixel P4. In this case, the light emitting layers of the organic light emitting layer 130 are not provided in the transmissive area TA.

The second electrode 140 may be provided over the organic light emitting layer 130 and the bank 125. The second electrode 140 may be provided in the transmissive area TA as well as the non-transmissive area NTA that includes the emission area EA, but is not limited thereto. The second electrode 140 may be provided only in the non-transmissive area NTA that includes the emission area EA, but may not be provided in the transmissive area TA to improve transmittance.

The second electrode 140 may be a common layer commonly provided in the subpixels P1, P2, P3 and P4 to apply the same voltage. The second electrode 140 may be formed of a conductive material that may transmit light. For example, the second electrode 140 may be formed of a low resistance metal material, for example, Ag, or alloy of Mg and Ag. The second electrode 140 may be a cathode electrode.

An encapsulation layer 150 may be provided over the light emitting diodes. The encapsulation layer 150 may be provided over the second electrode 140 to overlay the second electrode 140. The encapsulation layer 150 serves to prevent oxygen or water from being permeated into the organic light emitting layer 130 and the second electrode 140. Accordingly, in some embodiments, the encapsulation layer 150 may include at least one inorganic layer and at least one organic layer.

Meanwhile, although not shown in FIG. 7 and FIG. 9, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels P1, P2, P3 and P4. In detail, the color filter CF may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA4 of the fourth subpixel P4, and may be a blue color filter that transmits blue light.

The color filter CF may further include a fourth color filter disposed to correspond to the emission area EA3 of the third subpixel P3. In this case, the fourth color filter may be made of a transparent organic material that transmits white light.

Meanwhile, a black matrix BM may be provided between color filters CF and between the color filter CF and the transmissive area TA. The black matrix BM may be disposed between the subpixels P1, P2, P3 and P4 to prevent a color mixture from occurring between adjacent subpixels P1, P2, P3 and P4. In addition, the black matrix BM may be provided between the subpixels P1, P2, P3 and P4 and the transmissive area TA so that light emitted from the subpixels P1, P2, P3 and P4 may not move to a side, for example, the transmissive area TA.

The black matrix BM may include a material that absorbs light, for example, a black dye that fully absorbs light of a visible light wavelength range.

In the transparent display panel 110 according to one embodiment of the present disclosure, when a defective subpixel occurs, the defective subpixel may be connected with its adjacent subpixel by the anode line AL. At this time, the anode line AL may be provided on the same layer as the first electrode 120 of the defective subpixel, and may be extended from the first electrode 120. Since the anode line AL is connected with the first electrode 120 at one end without a separate contact hole, only one welding point WP may be provided at the other end.

In the transparent display panel 110 according to one embodiment of the present disclosure described as above, since only one welding point WP for irradiating a laser to connect a defective subpixel with a normal subpixel is provided, the number of times for irradiating the laser and an area to where the laser is irradiated may remarkably be reduced during the welding process. Therefore, the transparent display panel 110 according to one embodiment of the present disclosure may reduce an influence on the circuit area or the light emitting element as the laser is irradiated.

Since the laser is irradiated to the welding point WP, the welding point WP may be disposed on the transmissive area TA by being spaced apart from the circuit area or the light emitting element in order to reduce or minimize the influence of the laser, and is beneficial to have a predetermined area (or a selected confined area). In the transparent display panel 110 according to one embodiment of the present disclosure, as the number of the welding points WP is reduced, the area where the welding point WP is provided in the transmissive area TA may remarkably be reduced. Therefore, the transparent display panel 110 according to one embodiment of the present disclosure may reduce or minimize deterioration of light transmittance, which is caused by the formation of the welding point WP.

In addition, in the transparent display panel 110 according to one embodiment of the present disclosure, the anode line AL of the defective subpixel may directly be connected with the source electrode SE or the drain electrode DE of the driving transistor DT of the normal subpixel or the second capacitor electrode CE2 of the capacitor Cst at the welding point WP. At this time, in the transparent display panel 110 according to one embodiment of the present disclosure, the anode line AL of the defective subpixel may be spaced apart from the first electrode 120 of the normal subpixel and thus may not be directly connected with the first electrode 120 of the normal subpixel.

Therefore, in the transparent display panel 110 according to one embodiment of the present disclosure, even though a short occurs between the first electrode 120 of the normal subpixel and the second electrode 140 due to particles, the signal from the driving transistor DT of the normal subpixel may be applied to the defective subpixel. In this case, the defective subpixel may indicate a subpixel in which a defect occurs in the driving transistor DT, and the normal subpixel may indicate a subpixel in which a defect does not occur in the driving transistor DT.

For example, particles may occur on an upper surface of the first electrode 120 of the normal subpixel during a manufacturing process, and a short may occur between the first electrode 120 and the second electrode 140 due to particles. In this case, when the anode line AL of the defective subpixel is connected with the first electrode 120 of the normal subpixel, the first electrode 120 of the normal subpixel fails to transfer the signal of the driving transistor DT to the anode line AL of the defective subpixel because the first electrode 120 of the normal subpixel causes a short with the second electrode 140.

On the other hand, when the anode line AL of the defective subpixel is directly connected with the driving transistor DT or the capacitor Cst of the normal subpixel like the transparent display panel 110 according to one embodiment of the present disclosure, the signal from the driving transistor DT of the normal subpixel may be applied to the anode line AL of the defective subpixel even though a short occurs between the first electrode 120 of the normal subpixel and the second electrode 140.

In addition, in the transparent display panel 110 according to one embodiment of the present disclosure, the anode line AL may be shorter a spaced distance between adjacent subpixels. In detail, the first anode line AL1 may be shorter than a spaced distance between the first subpixels P1 adjacent to each other in the first direction, and the second anode line AL2 may be shorter than a spaced distance between the second subpixels P2 adjacent to each other in the second direction. In addition, the third anode line AL3 may be shorter than a spaced distance between the third subpixels P3 adjacent to each other in the first direction, and the fourth anode line AL4 may be shorter than a spaced distance between the fourth subpixels P4 adjacent to each other in the second direction.

As described above, in the transparent display panel 110 according to one embodiment of the present disclosure, as the anode line AL is formed to be shorter than the spaced distance between the adjacent subpixels, a total length of the anode line AL may be reduced. Therefore, in the transparent display panel 110 according to one embodiment of the present disclosure, loss of transparency due to the anode line AL may be reduced.

In addition, in the transparent display panel 110 according to one embodiment of the present disclosure, one of the first to fourth anode lines AL1, AL2, AL3 and AL4 may be disposed in each of the four sides of the transmissive area TA. For example, the first anode line AL1 may be disposed at the first side of the transmissive area TA, and the third anode line AL3 may be disposed at the second side facing the first side of the transmissive area TA. The second anode line AL2 may be disposed at the third side connecting the first side with the second side of the transmissive area TA, and the fourth anode line AL4 may be disposed at the fourth side facing the third side of the transmissive area TA.

In the transparent display panel 110 according to one embodiment of the present disclosure, since a plurality of anode lines are not disposed at one side of the transmissive area TA, one anode line does not need to be extended by bypassing a welding point of another anode line. Therefore, in the transparent display panel 110 according to one embodiment of the present disclosure, each of the first to fourth anode lines AL1, AL2, AL3 and AL4 may be provided in a straight line, and therefore the length of each of the first to fourth anode lines AL1, AL2, AL3 and AL4 may be reduced or minimized. The transparent display panel 110 according to one embodiment of the present disclosure may reduce or minimize deterioration of light transmittance, which is caused by the anode line AL.

Figure 10:
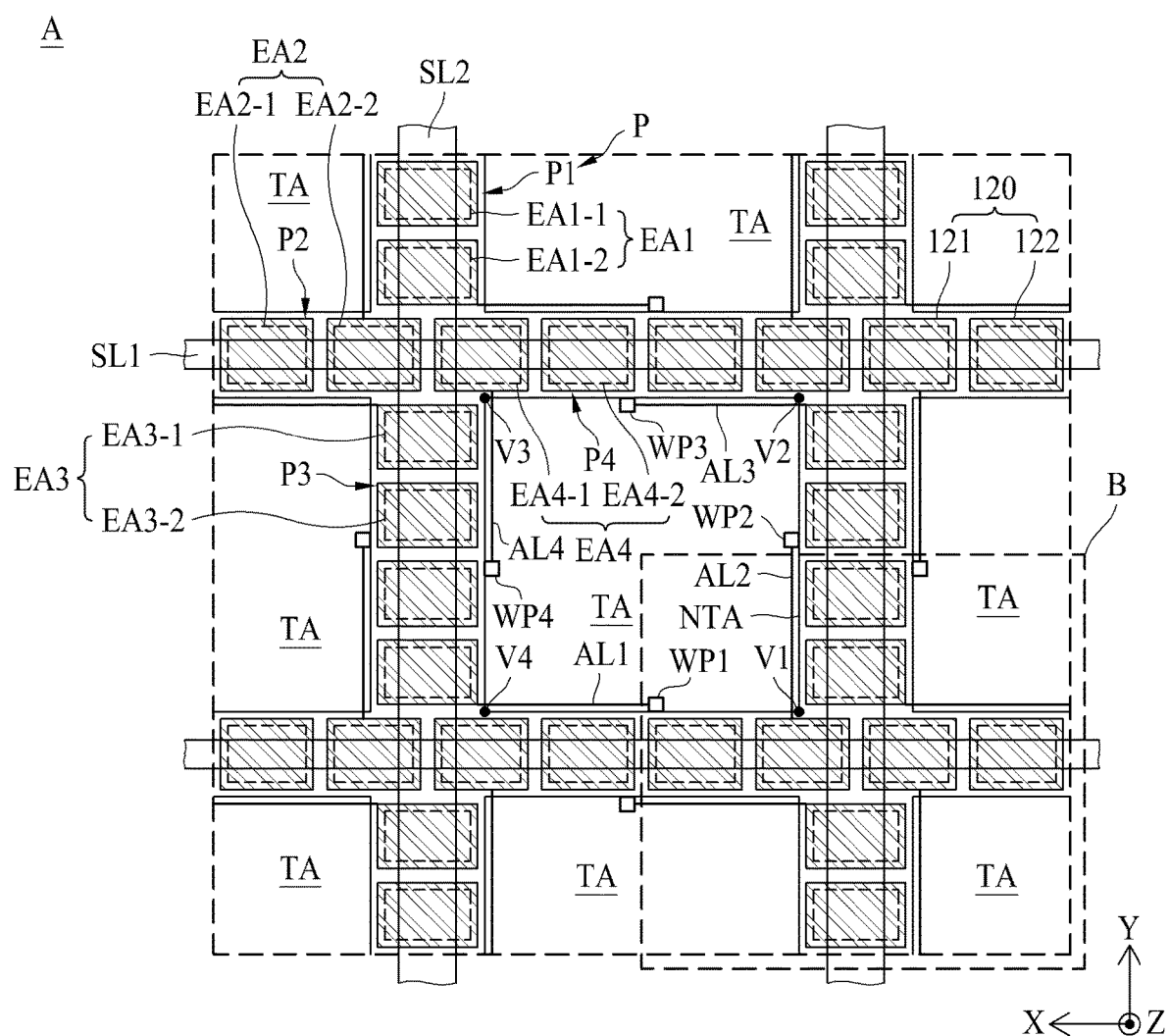
FIG. 10 is an enlarged view illustrating another example of an area A of FIG. 2.
Figure 11:
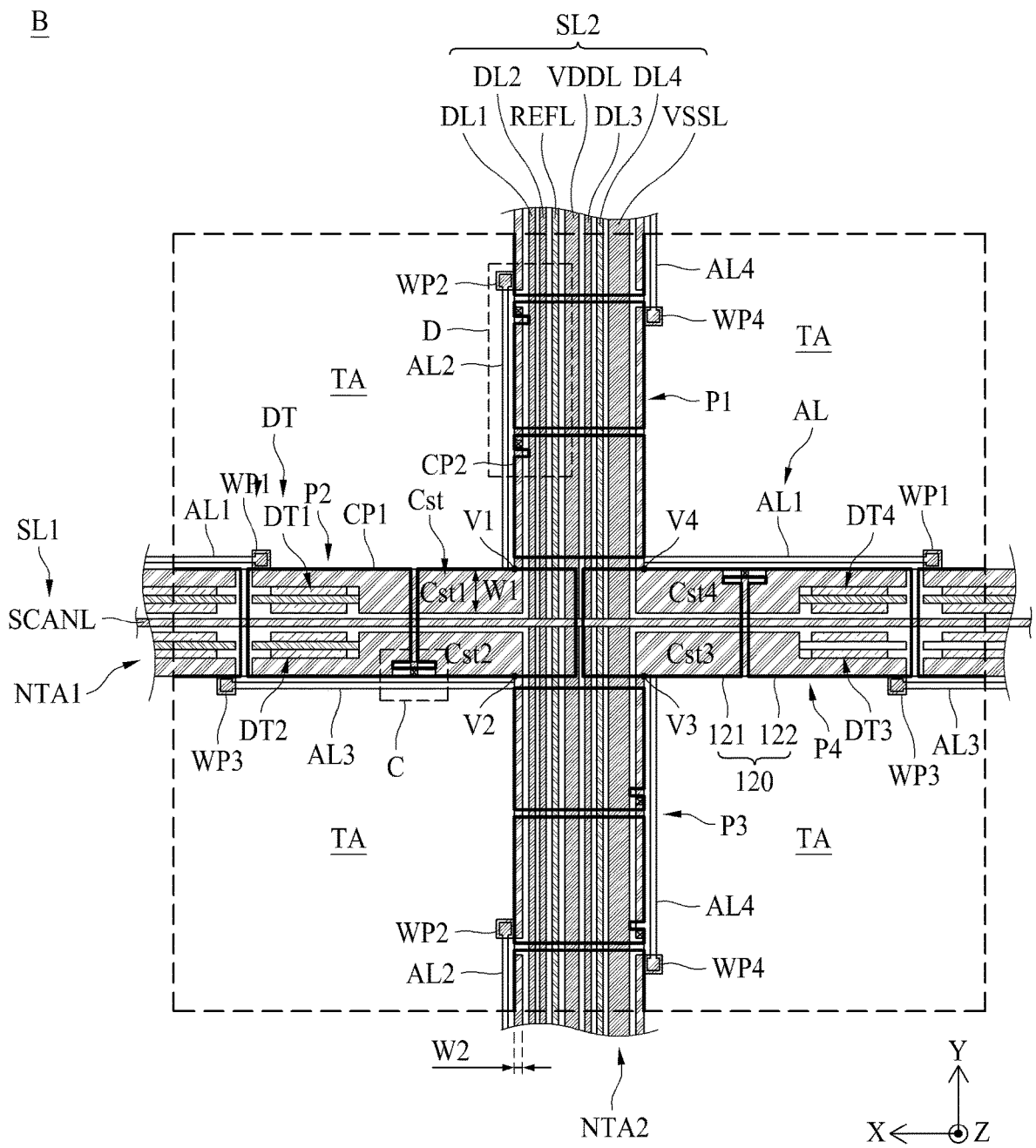
FIG. 11 is a view illustrating an area B of FIG. 10.
Figure 12:
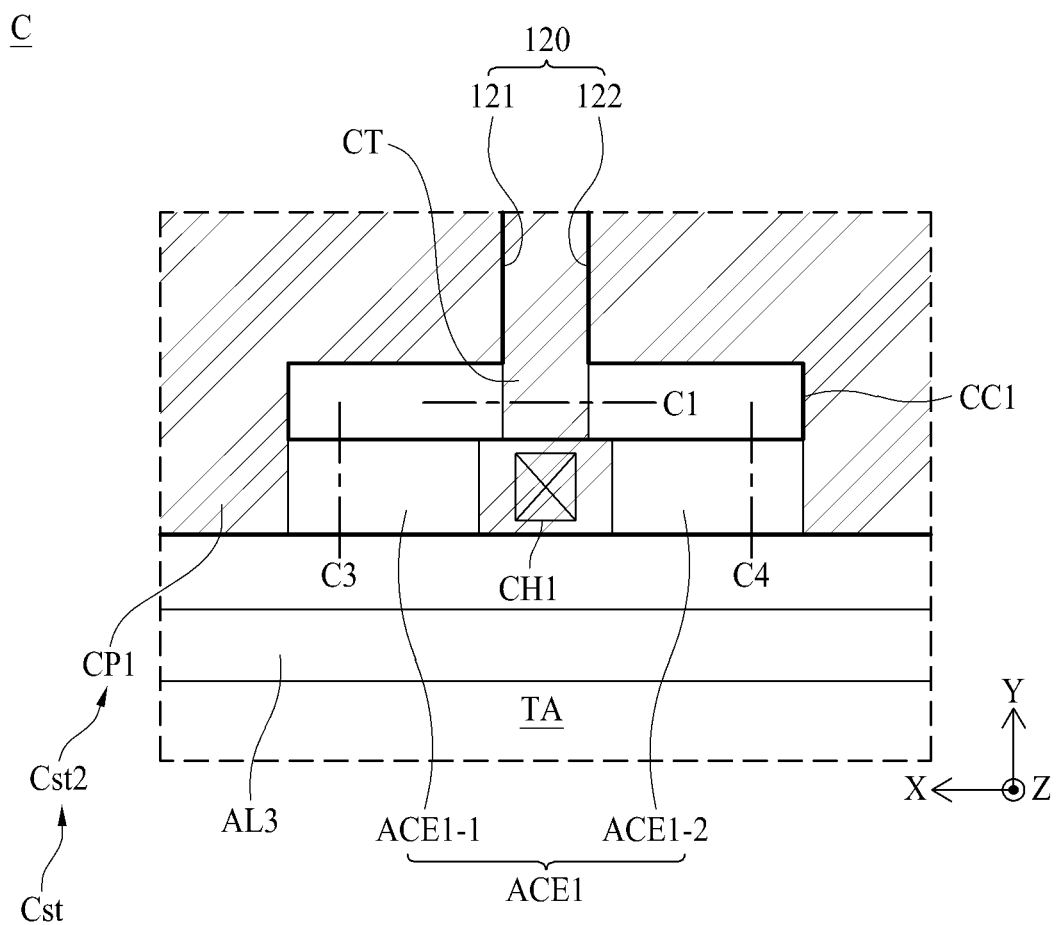
FIG. 12 is a view illustrating an area C of FIG. 11.
Figure 13:
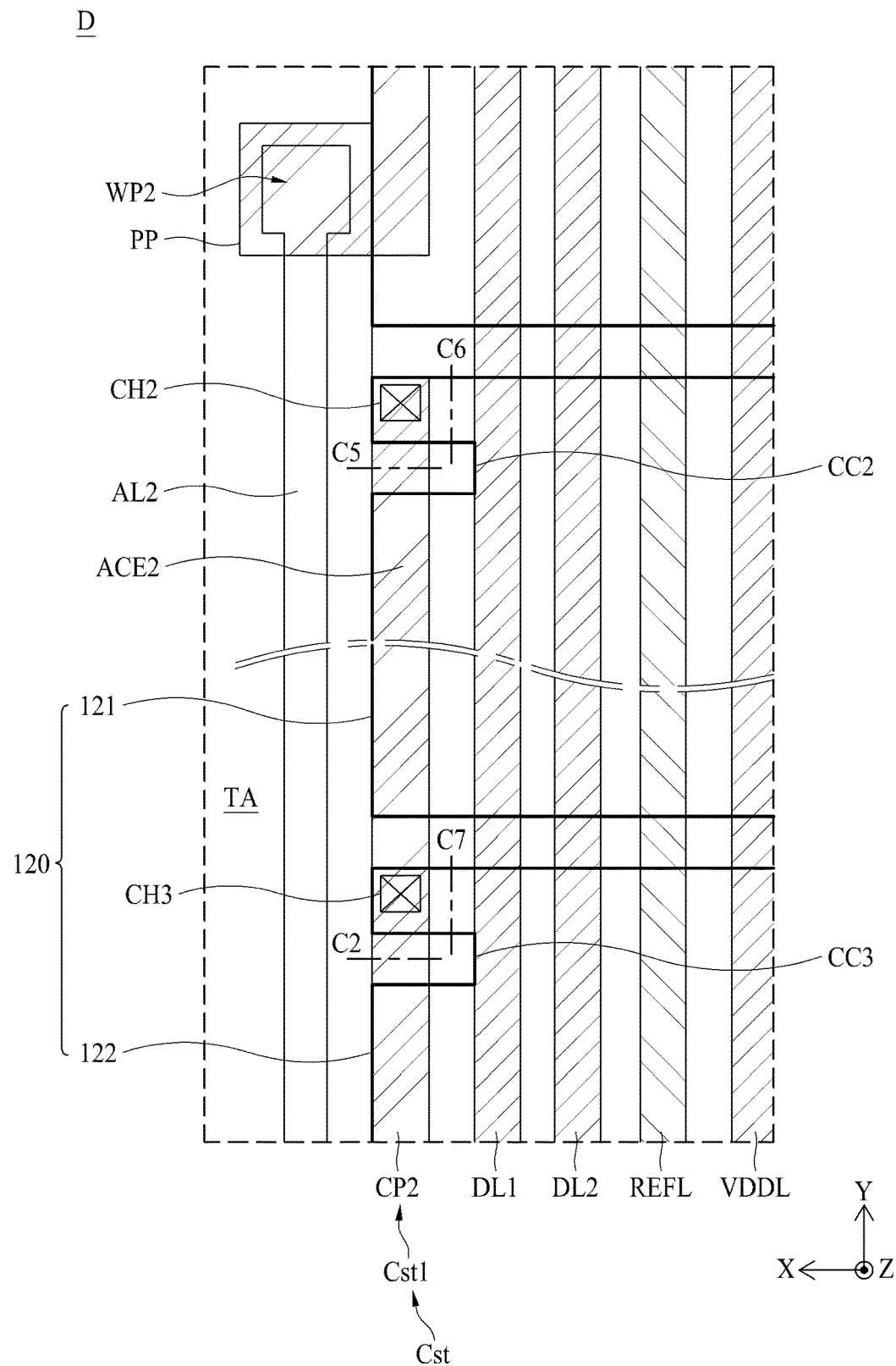
FIG. 13 is a view illustrating an area D of FIG. 11.

FIG. 10 is an enlarged view illustrating another example of an area A of FIG. 2, FIG. 11 is a view illustrating an area B of FIG. 10, FIG. 12 is a view illustrating an area C of FIG. 11, and FIG. 13 is a view illustrating an area D of FIG. 11.

The transparent display panel 110 shown in FIGS. 10 to 13 is different from the transparent display panel 110 shown in FIGS. 3 to 9 in that the first electrode 120 includes a first divided electrode 121 and a second divided electrode 122.

The following description will be based on a difference the transparent display panel 110 shown in FIGS. 3 to 9, and a detailed description of the same elements as those in FIGS. 3 to 9 will be omitted.

Unlike the transparent display panel 110 shown in FIGS. 3 to 9, the plurality of subpixels P1, P2, P3 and P4 provided in the transparent display panel 110 shown in FIGS. 10 to 13 may include a plurality of light emission areas divided from light emission areas EA1, EA2, EA3 and EA4. In detail, the first light emission area EA1 provided in the first subpixel P1 may include two divided emission areas, that is, a first divided light emission area EA1-1 and a second divided light emission area EA1-2. The second light emission area EA2 provided in the second subpixel P2 may include two divided emission areas, that is, a first divided light emission area EA2-1 and a second divided light emission area EA2-2. The third light emission area EA3 provided in the third subpixel P3 may include two divided emission areas, that is, a first divided light emission area EA3-1 and a second divided light emission area EA3-2. The fourth light emitting area EA4 provided in the fourth subpixel P4 may include two divided emission areas, that is, a first divided light emission area EA4-1 and a second divided light emission area EA4-2.

The second subpixel P2 and the fourth subpixel P4 may be provided to overlap at least portion of the first signal line SL1, and may alternately be disposed along the first signal line SL1.

The first subpixel P1 and the third subpixel P3 may be provided to overlap at least portion of the second signal line SL2, and may alternately be disposed along the second signal line SL2.

As shown in FIG. 10, the second subpixel P2 and the fourth subpixel P4 may be provided in the area where the first signal line SL1 and the second signal line SL2 cross or overlap each other, but are not limited thereto.

In another embodiment, the first subpixel P1 and the third subpixel P3 may be disposed in the area where the first signal line SL1 and the second signal line SL2 cross or overlap each other. In this case, the second subpixel P2 and the fourth subpixel P4 may be spaced apart from each other in the area where the first signal line SL1 and the second signal line SL2 cross or overlap each other with the first subpixel P1 and the third subpixel P3, which are interposed therebetween.

Each of the first subpixel P1, the second subpixel P2, the third subpixel P3 and the fourth subpixel P4 may include a circuit element including a capacitor Cst, a thin film transistor, and the like, and a light emitting element. The thin film transistor may include a switching transistor, a sensing transistor, and a driving transistor DT.

Since the driving transistor DT and the capacitor Cst, which are provided in the transparent display panel 110 shown in FIGS. 10 to 13 are substantially the same as those provided in the transparent display panel 110 shown in FIGS. 3 to 9, their detailed description will be omitted.

The light emitting element provided in each of the first subpixel P1, the second subpixel P2, the third subpixel P3 and the fourth subpixel P4 may include a first electrode 120, an organic light emitting layer 130, and a second electrode 140.

The first electrode 120 may be provided over the planarization film PLN and may electrically be connected with the driving transistor DT. The first electrode 120 may be provided for each of the subpixels P1, P2, P3 and P4. One first electrode 120 may be provided in the first subpixel P1, another first electrode 120 may be provided in the second subpixel P2, still another first electrode 120 may be provided in the third subpixel P3, and further still another first electrode 120 may be provided in the fourth subpixel P4. The first electrode 120 is not provided in the transmissive area TA.

The first electrode 120 may be formed of a metal material having high reflectance or a deposited structure of a metal material having high reflectance and a transparent metal material. For example, the first electrode 120 may be made of a metal material of high reflectance such as a deposited structure (Ti/Al/Ti) of Al and Ti, a deposited structure (ITO/Al/ITO) of Al and ITO, Ag alloy, and a deposited structure (ITO/Ag alloy/ITO) of Ag alloy and ITO. The Ag alloy may be an alloy of Ag, Pd and Cu. The first electrode 120 may be an anode electrode.

The first electrodes 120 provided in each of the plurality of subpixels P1, P2, P3 and P4 may be provided in a plural number. For example, the first electrode 120 provided in each of the plurality of subpixels P1, P2, P3 and P4 may include a first divided electrode 121, a second divided electrode 122, and a connection electrode ACE.

The first divided electrode 121 may be disposed over the first divided light emission areas EA1-1, EA2-1, EA3-1 and EA4-1, and the second divided electrode 122 may be disposed over the second divided light emission areas EA1-2, EA2-2, EA3-2 and EA4-2.

The first divided electrode 121 and the second divided electrode 122 may be spaced apart from each other on the same layer in the first direction or the second direction. In detail, the first and second divided electrodes 121 and 122 respectively provided in the first subpixel P1 and the third subpixel P3 may be spaced apart from each other on the second signal line SL2 in the second direction. The first and second divided electrodes 121 and 122 respectively provided in the second subpixel P2 and the fourth subpixel P4 may be spaced apart from each other on the first signal line SL1 in the first direction.

The connection electrode ACE may connect the first divided electrode 121 with the second divided electrode 122. The connection electrode ACE may include a first connection electrode ACE1 connecting the first divided electrode 121 and the second divided electrode 122, which are spaced apart from each other in the first direction, with each other, and a second connection electrode ACE2 connecting the first divided electrode 121 and the second divided electrode 122, which are spaced apart from each other in the second direction, with each other.

The first connection electrode ACE1 may be extended in the first direction to connect the first divided electrode 121 and the second divided electrode 122, which are spaced apart from each other in the first direction, with each other in a straight line. In detail, the first connection electrode ACE1 may not be provided toward the transmissive area TA, and may have one end connected with the first divided electrode 121 and the other end connected with the second divided electrode 122 to constitute a straight line. In addition, a boundary between the first connection electrode ACE1 and the transmissive area TA may form a straight line with a boundary between the first divided electrode 121 and the transmissive area TA and a boundary between the second divided electrode 122 and the transmissive area TA.

The first connection electrode ACE1 may include a first connection portion ACE1-1 and a second connection portion ACE1-2. The first connection portion ACE1-1 may be connected with the first divided electrode 121 and extended from the first divided electrode 121 toward the second divided electrode 122 as much as a predetermined length (or a selected length for other embodiments). The second connection portion ACE1-2 may be connected with the second divided electrode 122 and extended from the second divided electrode 122 toward the first divided electrode 121 as much as a predetermined length (or a selected length for other embodiments). The first connection portion ACE1-1 and the second connection portion ACE1-2 may be connected with each other in a straight line. Therefore, the first divided electrode 121 may electrically be connected with the second divided electrode 122 through the first connection electrode ACE1.

The first connection portion ACE1-1 and the second connection portion ACE1-2 may be provided on the same layer as the first divided electrode 121 and the second divided electrode 122. In addition, the first connection portion ACE1-1 and the second connection portion ACE1-2 may integrally be provided with the first divided electrode 121 and the second divided electrode 122.

The first electrode 120 may electrically be connected with the second capacitor electrode CE2 of the capacitor Cst through the contact electrode CT. In detail, a portion of the plurality of capacitors Cst may include a concave portion in the first capacitor pattern portion CP1. For example, each of the second capacitor Cst2 connected with the second subpixel P2 and the fourth capacitor Cst4 connected with the fourth subpixel P4 may include a first concave portion CC1 that forms a concave area in the first capacitor pattern portion CP1 in a direction from the transmissive area TA toward the first signal line SL1. In this case, as shown in FIGS. 11 and 12, at least a portion of the first connection electrode ACE1 may overlap the concave area of the first capacitor pattern portion CP1 of each of the second capacitor Cst2 and the fourth capacitor Cst4.

Meanwhile, the contact electrode CT may be protruded from the first concave portion CC1 of the first capacitor pattern portion CP1 toward the transmissive area TA, and at least a portion thereof may overlap the first connection electrode ACE1. At this time, the contact electrode CT may be protruded from the second capacitor electrode CE2 provided in the first capacitor pattern portion CP1.

The first connection electrode ACE1 may be connected with the contact electrode CT through the first contact hole CH1 in the area overlapped with the contact electrode CT. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the first connection electrode ACE1, the contact electrode CT, and the second capacitor electrode CE2 of the capacitor Cst.

As described above, in the transparent display panel 110 according to another embodiment of the present disclosure, a third cutting area C3 and a fourth cutting area C4 may be provided in the first connection electrode ACE1. In detail, the first connection electrode ACE1 may include the third cutting area C3 between the first contact hole CH1 and the first divided electrode 121, and the fourth cutting area C4 between the first contact hole CH1 and the second divided electrode 122.

In the transparent display panel 110 according to another embodiment of the present disclosure, when any one of the first divided electrode 121 and the second divided electrode 122, which are spaced apart from each other in the first direction, operates in error due to particles that may occur during a process, the transparent display panel 110 may be repaired by laser cutting for at least one of the first connection portion ACE1-1 or the second connection portion ACE1-2 of the first connection electrode ACE1.

For example, in the transparent display panel 110 according to another embodiment of the present disclosure, when a short occurs between the first electrode 120 and the second electrode 140 due to particles in the area in which the first divided electrode 121 is provided, the transparent display panel 110 may be repaired by laser cutting for the third cutting area C3 of the first connection portion ACE1-1.

For another example, in the transparent display panel 110 according to another embodiment of the present disclosure, when a short occurs between the first electrode 120 and the second electrode 140 due to particles in the area in which the second divided electrode 122 is provided, the transparent display panel 110 may be repaired by laser cutting for the fourth cutting area C4 of the second connection portion ACE1-2.

In the transparent display panel 110 according to another embodiment of the present disclosure, only the corresponding divided electrodes among the plurality of divided electrodes 121 and 122 may be short-circuited through laser cutting even though a dark spot occurs due to particles, whereby a light loss rate due to occurrence of the dark spot may be reduced.

In addition, in the transparent display panel 110 according to another embodiment of the present disclosure, the first cutting area C1 may be provided in the contact electrode CT. In detail, the contact electrode CT may include the first cutting area C1 between the first contact hole CH1 and the first capacitor pattern portion CP1.

In the transparent display panel 110 according to another embodiment of the present disclosure, when a particular subpixel operates in error by the driving transistor DT, the transparent display panel 110 may be repaired by laser cutting for the first cutting area C1 of the contact electrode CT.

Meanwhile, the second connection electrode ACE2 may be extended in the second direction to connect the first divided electrode 121 and the second divided electrode 122, which are spaced apart from each other in the second direction, with each other in a straight line. In detail, the second connection electrode ACE2 may not be provided toward the transmissive area TA, and may have one end connected with the first divided electrode 121 and the other end connected with the second divided electrode 122 to constitute a straight line. In addition, a boundary between the second connection electrode ACE2 and the transmissive area TA may form a straight line with the boundary between the first divided electrode 121 and the transmissive area TA and the boundary between the second divided electrode 122 and the transmissive area TA.

In one embodiment, the second connection electrode ACE2 may be provided on the same layer as at least one of the first capacitor electrode CE1 and the second capacitor electrode CE2 of the second capacitor pattern portion CP2. For example, the second connection electrode ACE2 may be the same layer as the second capacitor electrode CE2 of the second capacitor pattern portion CP2, but is not limited thereto. The second connection electrode ACE2 may be a double layer, which is the same layer as each of the first capacitor electrode CE1 and the second capacitor electrode CE2 of the second capacitor pattern portion CP2. In this case, the second connection electrode ACE2 may integrally be provided with at least one of the first capacitor electrode CE1 and the second capacitor electrode CE2 of the second capacitor pattern portion CP2.

The second connection electrode ACE2 may be connected with the first divided electrode 121 and the second divided electrode 122, which are spaced apart from each other in the second direction, through a contact hole.

The second connection electrode ACE2 may be connected with the first divided electrode 121 through the second contact hole CH2 at one end. The second connection electrode ACE2 may be extended in a straight line from the first divided electrode 121 by a predetermined length (or a selected length for other embodiments) in the direction of the second divided electrode 122, and may be connected with the second divided electrode 122 through the third contact hole CH3 at the other end. Therefore, the first divided electrode 121 may electrically be connected with the second divided electrode 122 through the second connection electrode ACE2.

On the other hand, the first electrode 120 may electrically be connected with the second capacitor electrode CE2 of the capacitor Cst through the second connection electrode ACE2. In detail, the second connection electrode ACE2 may integrally be provided with the second capacitor electrode CE2 of the second capacitor pattern portion CP2. Therefore, the first electrode 120 including the first divided electrode 121 and the second divided electrode 122, which are connected with the second connection electrode ACE2 through the contact holes CH2 and CH3, may electrically be connected with the second capacitor electrode CE2 of the second capacitor pattern portion CP2. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the second connection electrode ACE2 and the second capacitor electrode CE2 of the capacitor Cst.

In the transparent display panel 110 according to another embodiment of the present disclosure described as above, a sixth cutting area C6 and a seventh cutting area C7 may be provided in the first electrode 120. In detail, the first divided electrode 121 may include the sixth cutting area C6 between the second contact hole CH2 and the second signal line SL2. The first divided electrode 121 provided over the second capacitor pattern portion CP2 may include a second concave portion CC2 that forms a concave area in a direction from the transmissive area TA toward the second signal line SL2 to expose a portion of the second connection electrode ACE2. The first divided electrode 121 may be connected to the second connection electrode ACE2 through the second contact hole CH2 at one side of the concave area by the second concave portion CC2. In this case, the sixth cutting area C6 of which width is reduced by the second concave portion CC2 may be provided between the area overlapped with the second contact hole CH2 and the area overlapped with the second signal line SL2.

The second divided electrode 122 may include the seventh cutting area C7 between the third contact hole CH3 and the second signal line SL2. The second divided electrode 122 provided over the second capacitor pattern portion CP2 may include a third concave portion CC3 that forms a concave area in a direction from the transmissive area TA toward the second signal line SL2 to expose a portion of the second connection electrode ACE2. The second divided electrode 122 may be connected with the second connection electrode ACE2 through the third contact hole CH3 at one side of the concave area by the third concave portion CC3. In this case, the seventh cutting area C7 of which width is reduced by the third concave portion CC3 may be provided between the area overlapped with the third contact hole CH3 and the area overlapped with the second signal line SL2.

In addition, in the transparent display panel 110 according to another embodiment of the present disclosure as described above, the fifth cutting area C5 and the second cutting area C2 may be provided in the second connection electrode ACE2. In detail, the second connection electrode ACE2 may include the fifth cutting area C5 exposed by the second concave portion CC2 of the first divided electrode 121 and the second cutting area C2 exposed by the third concave portion CC3 of the second divided electrode 122.

In the transparent display panel 110 according to another embodiment of the present disclosure, when any one of the first divided electrode 121 and the second divided electrode 122, which are spaced apart from each other in the second direction, operates in error due to particles that may occur during the process, the transparent display panel 110 may be repaired by laser cutting for at least a portion of the first divided electrode 121 or the second divided electrode 122 and a portion of the second connection electrode ACE2.

For example, in the transparent display panel 110 according to another embodiment of the present disclosure, when a short occurs between the first electrode 120 and the second electrode 140 due to particles in the area in which the first divided electrode 121 is provided, the transparent display panel 110 may be repaired by laser cutting for the sixth cutting area C6 of the first divided electrode 121 or the fifth cutting area C5 of the second connection electrode ACE2.

For another example, in the transparent display panel 110 according to another embodiment of the present disclosure, when a short occurs between the first electrode 120 and the second electrode 140 due to particles in the area in which the second divided electrode 122 is provided, the transparent display panel 110 may be repaired by laser cutting for the seventh cutting area C7 of the second divided electrode 122.

In the transparent display panel 110 according to another embodiment of the present disclosure, only the corresponding divided electrodes among the plurality of divided electrodes 121 and 122 may be short-circuited through laser cutting even though a dark spot occurs due to particles, whereby a light loss rate due to occurrence of the dark spot may be reduced.

In addition, in the transparent display panel 110 according to another embodiment of the present disclosure, when a particular subpixel operates in error by the driving transistor DT, the transparent display panel 110 may be repaired by laser cutting for the second cutting area C2 of the second connection electrode ACE2.

In the transparent display panel 110 according to another embodiment of the present disclosure, a signal of a subpixel, which has the same color as that of a subpixel having a defect in the driving transistor DT and is adjacent to the defective subpixel, may be applied to the defective subpixel through the anode line AL.

In detail, in the transparent display panel 110 according to another embodiment of the present disclosure, the anode line AL may be provided over at least one side of the transmissive area TA. The anode line AL may be extended from the first electrode 120 of each of the plurality of subpixels P1, P2, P3 and P4 and at least a portion thereof may overlap the driving transistor DT or the capacitor Cst of another adjacent subpixel having the same color. The anode line AL may include a first anode line AL1, a second anode line AL2, a third anode line AL3, and a fourth anode line AL4. Since the first anode line AL1, the second anode line AL2, the third anode line AL3 and the fourth anode line AL4 are substantially the same as those shown in FIGS. 3 to 9, their detailed description will be omitted.

In the transparent display panel 110 according to another embodiment of the present disclosure, only the corresponding divided electrodes among the plurality of divided electrodes 121 and 122 may be short-circuited through laser cutting even through a dark spot occurs due to particles, whereby a light loss rate due to occurrence of the dark spot may be reduced.

In the transparent display panel 110 according to another embodiment of the present disclosure, the first connection electrode ACE1 and the second connection electrode ACE2, which connect two divided electrodes 121 and 122 with each other, are not protruded toward the transmissive area TA, whereby a size of the transmissive area TA may not be reduced by the first connection electrode ACE1 and the second connection electrode ACE2. That is, in the transparent display panel 110 according to another embodiment of the present disclosure, light transmittance may be prevented from being reduced by the first connection electrode ACE1 and the second connection electrode ACE2. In addition, in the transparent display panel 110 according to another embodiment of the present disclosure, even though the anode line AL does not bypass the first connection electrode ACE1 and the second connection electrode ACE2, the anode line AL may be provided in a straight line, whereby the anode line AL may have a minimum length.

In addition, in the transparent display panel 110 according to another embodiment of the present disclosure, the first connection electrode ACE1 and the second connection electrode ACE2 are provided in a straight line, whereby the boundary of the transmissive area TA may not have an uneven shape. Therefore, in the transparent display panel 110 according to another embodiment of the present disclosure, haze may be reduced, and image readability may be improved.

In addition, in the transparent display panel 110 according to another embodiment of the present disclosure, a concave area may be provided in the first capacitor pattern portion CP1 of a portion of the plurality of capacitors Cst, and the first connection electrode ACE1 may be disposed in the concave area of the first capacitor pattern portion CP1. In the transparent display panel 110 according to another embodiment of the present disclosure, as the concave area is provided in the first capacitor pattern portion CP1, the size of the first capacitor pattern portion CP1 may be reduced, whereby a capacitor capacity may be reduced. However, in the transparent display panel 110 according to another embodiment of the present disclosure, the second capacitor pattern portion CP2 may be provided to be extended from one end of the first capacitor pattern portion CP1 in the second direction, whereby a total area of the capacitor Cst may not be reduced.

In addition, in the transparent display panel 110 according to another embodiment of the present disclosure, the second capacitor pattern portion CP2 of a portion of the plurality of capacitors Cst may be used as the second connection electrode ACE2. Therefore, the transparent display panel 110 according to another embodiment of the present disclosure does not need to make sure of a separate space in order to dispose the second connection electrode ACE2, whereby the area of the second capacitor pattern portion CP2 may not be reduced.

As a result, the transparent display panel 110 according to another embodiment of the present disclosure may sufficiently make sure of a capacity of the capacitor Cst, and at the same time may have high light transmittance by providing the first connection electrode ACE1 and the second connection electrode ACE2 in a straight line.

In the transparent display panel 110 according to another embodiment of the present disclosure, the first to fourth driving transistors DT1, DT2, DT3 and DT4 may be disposed to be symmetrical with one another. In detail, the first driving transistor DT1 of the first subpixel P1 may be symmetrical with the second driving transistor DT2 of the second subpixel P2 based on a first axis (e.g., X-axis). The third driving transistor DT3 of the third subpixel P3 may be symmetrical with the fourth driving transistor DT4 of the fourth subpixel P4 based on the first axis (e.g., X-axis). The first driving transistor DT1 of the first subpixel P1 and the second driving transistor DT2 of the second subpixel P2 may be symmetrical with the third driving transistor DT3 of the third subpixel P3 and the fourth driving transistor DT4 of the fourth subpixel P4 based on a second axis (e.g., Y-axis).

In addition, in the transparent display panel 110 according to another embodiment of the present disclosure, the first to fourth capacitors Cst1, Cst2, Cst3 and Cst4 may be disposed to be symmetrical with one another. In detail, the first capacitor Cst1 of the first subpixel P1 may be symmetrical with the second capacitor Cst2 of the second subpixel P2 based on the first axis (e.g., X-axis). The third capacitor Cst3 of the third subpixel P3 may be symmetrical with the fourth capacitor Cst4 of the fourth subpixel P4 based on the first axis (e.g., X-axis). The first capacitor Cst1 of the first subpixel P1 and the second capacitor Cst2 of the second subpixel P2 may be symmetrical with the third capacitor Cst3 of the third subpixel P3 and the fourth capacitor Cst4 of the fourth subpixel P4 based on the second axis (e.g., Y-axis).

In the transparent display panel 110 according to another embodiment of the present disclosure, the first capacitor pattern portion CP1 of the capacitor Cst and the driving transistor DT of each of the first to fourth subpixels P1, P2, P3 and P4 may be provided between the areas, in which the first non-transmissive area NTA1 and the second non-transmissive area NTA2 overlap each other, in the first non-transmissive area NTA1. That is, in the transparent display panel 110 according to another embodiment of the present disclosure, the driving transistor DT is not provided in the second non-transmissive area NTA2. Therefore, in the transparent display panel 110 according to one embodiment of the present disclosure, the driving transistor DT is spaced apart from the second signal line SL2, particularly the pixel power line VDDL and the common power line VSSL, whereby parasitic capacitance may not occur or may be reduced or minimized between the driving transistor DT and the second signal line SL2.

In addition, in the transparent display panel 110 according to another embodiment of the present disclosure, the second capacitor pattern portion CP2 of the capacitor Cst is provided in the second non-transmissive area NTA2, but may be thinner than the first capacitor pattern portion CP1. Therefore, in the transparent display panel 110 according to another embodiment of the present disclosure, the width of the second non-transmissive area NTA2 may be reduced or minimized, and light transmittance may be improved.

In addition, in the transparent display panel 110 according to another embodiment of the present disclosure, the capacitor Cst has an L-shape. Therefore, even though the driving transistor DT of each of the first through fourth subpixels P1, P2, P3 and P4 is disposed in the first non-transmissive area NTA1, the driving transistor DT may be connected with the first electrode 120 of the subpixels P1 and P3 disposed in the second non-transmissive area NTA2.

In particular, in the transparent display panel 110 according to another embodiment of the present disclosure, the first capacitor pattern portion CP1 and the second capacitor pattern portion CP2 of the capacitor Cst are provided along an outer portion of the transmissive area TA, whereby the degree of freedom in design of the contact electrode CT for connection with the first electrode 120 of each of the first to fourth subpixels P1, P2, P3 and P4 may be improved.

In addition, in the transparent display panel 110 according to another embodiment of the present disclosure, the capacitor Cst does not overlap the first signal line SL1 and the second signal line SL2. In particular, in the transparent display panel 110 according to another embodiment of the present disclosure, the capacitor Cst is not provided between the plurality of signal lines included in the second signal line SL2, whereby parasitic capacitance caused by the signal lines may be reduced or minimized.

Figure 14:
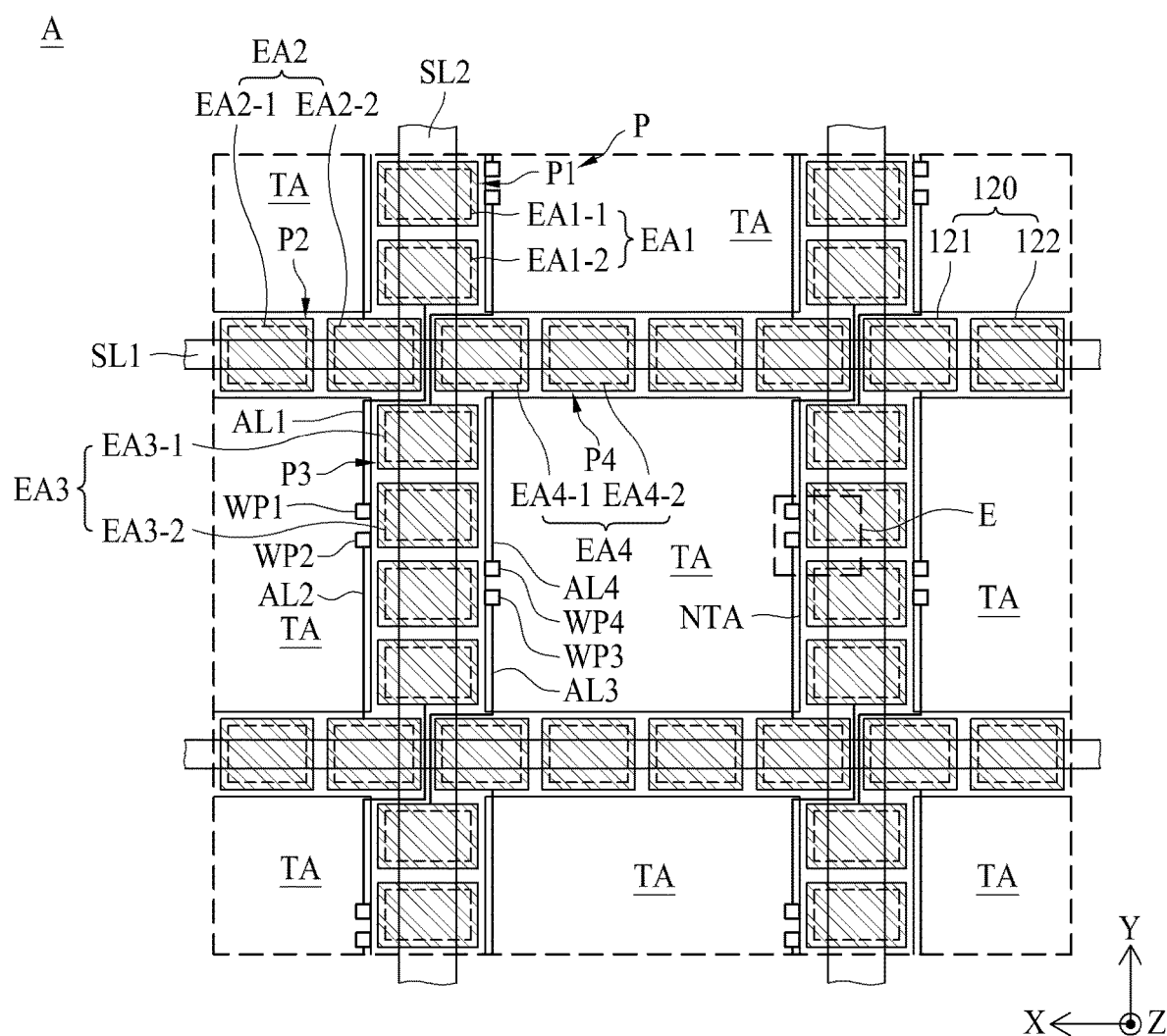
FIG. 14 is an enlarged view illustrating other example of an area A of FIG. 2.
Figure 15:
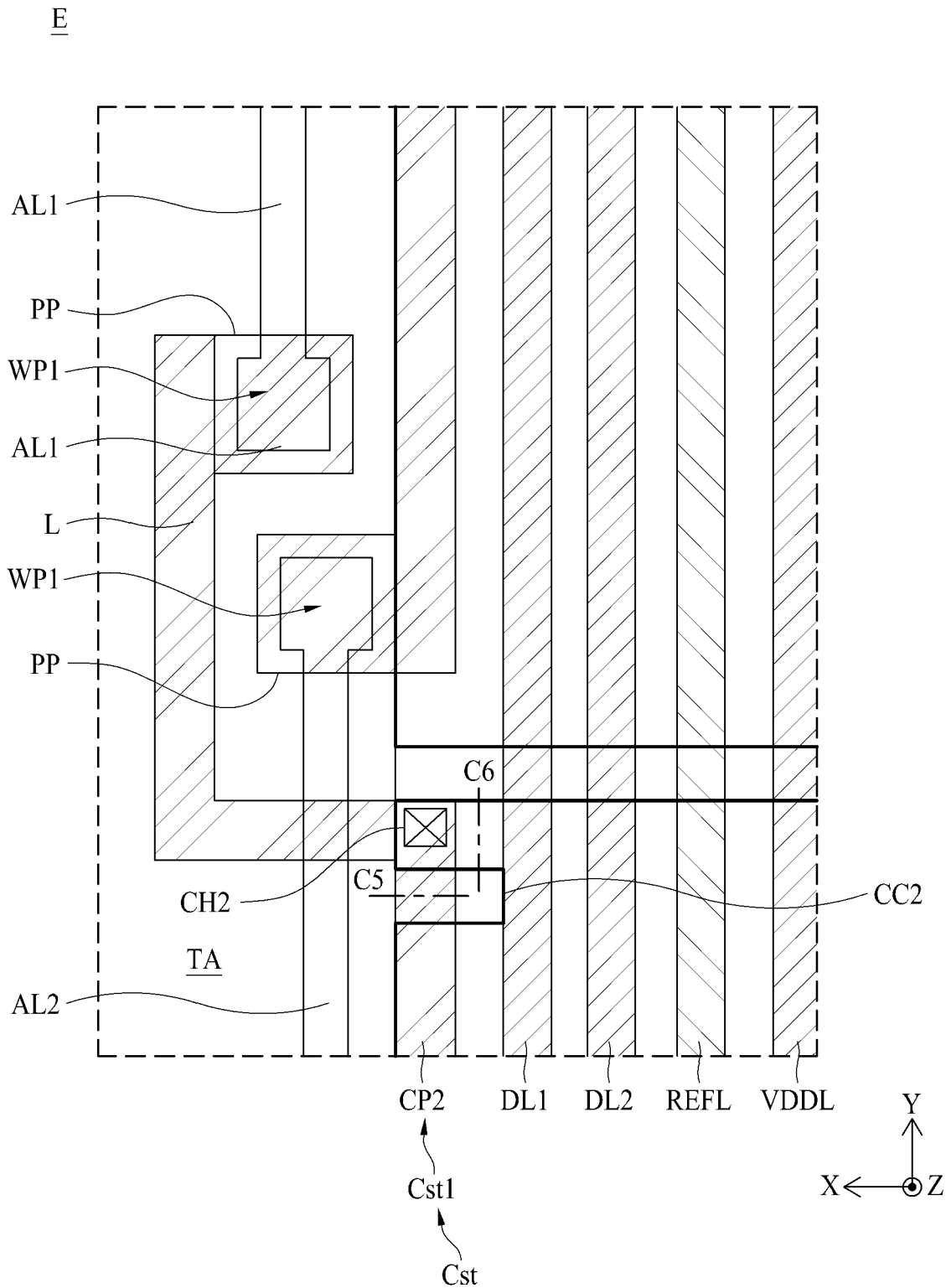
FIG. 15 is a view illustrating an area E of FIG. 14.

FIG. 14 is an enlarged view illustrating other example of an area A of FIG. 2, and FIG. 15 is a view illustrating an area E of FIG. 14.

The transparent display panel 110 shown in FIGS. 14 to 15 is different from the transparent display panel 110 shown in FIGS. 3 to 9 and the transparent display panel 110 shown in FIGS. 10 to 13 in that the first to fourth anode lines AL1, AL2, AL3 and AL4 are all extended in the second direction.

The following description will be based on the first to fourth anode lines AL1, AL2, AL3 and AL4, and a detailed description of the same elements as those of the transparent display panel 110 shown in FIGS. 3 to 9 or the transparent display panel 110 shown in FIGS. 10 to 13 will be omitted.

In the transparent display panel 110 according to another embodiment of the present disclosure, a signal of a subpixel, which has the same color as that of a defective subpixel and is adjacent to the defective subpixel, may be applied to the defective subpixel through the anode line AL.

In detail, in the transparent display panel 110 according to another embodiment of the present disclosure, the anode line AL may be provided over at least one side of the transmissive area TA. The anode line AL may be extended from the first electrode 120 of each of the plurality of subpixels P1, P2, P3 and P4 and at least a portion thereof may overlap the capacitor Cst electrically connected with the driving transistor DT of another adjacent subpixel having the same color. The anode line AL may include a first anode line AL1, a second anode line AL2, a third anode line AL3, and a fourth anode line AL4.

The first anode line AL1 may be provided between two first subpixels P1 adjacent to each other in the second direction. The first anode line AL1 may be protruded from the first electrode 120 of one of the two first subpixels P1 disposed to be adjacent to each other in the second direction, and then may be extended toward the other first subpixel P1.

The first subpixels P1 may be disposed in the second direction with the third subpixel P3 interposed therebetween. In this case, the first anode line AL1 may be extended from the first electrode 120 of each of the first subpixels P1 in the second direction to pass through the third subpixel P3, and then at least a portion thereof may overlap the first capacitor Cst1 connected with the first driving transistor DT1 of the first subpixel P1 adjacent thereto in the second direction.

As shown in FIG. 15, the second subpixel P2 and the fourth subpixel P4 may be disposed in the area where the first signal line SL1 and the second signal line SL2 overlap each other. In this case, the first anode line AL1 may pass through the third subpixel P3 after passing between the second subpixel P2 and the fourth subpixel P4, and then at least a portion thereof may overlap the first capacitor Cst1 of the first subpixel P1 adjacent thereto in the second direction.

For example, the first anode line AL1 may be protruded from the first electrode 120 of each of the first subpixels P1 and extended between the second subpixel P2 and the fourth subpixel P4. The first anode line AL1 may be extended in the second direction along one side of the third subpixel P3. In this case, the first anode line AL1 may be extended between the third subpixel P3 and the transmissive area TA.

The first capacitor pattern portion CP1 of the first capacitor Cst1 may be disposed between the first signal line SL1 and the transmissive area TA at the first side of the first signal line SL1, and the second capacitor pattern portion CP2 thereof may be disposed between the second signal line SL2 and the transmissive area TA by being bent at one end of the first capacitor pattern portion CP1. The second capacitor electrode CE2 of the second capacitor pattern portion CP2 may include a first protrusion portion PP1 protruded toward the transmissive area TA to contact the first anode line AL1 of the first subpixel P1 disposed to be adjacent thereto in the second direction.

The first anode line AL1 may not be extended to the second capacitor pattern portion CP2 of the first capacitor Cst1 provided in the neighboring first subpixel P1. Therefore, the first anode line AL1 may not overlap the second anode line AL2. In this case, the first protrusion portion PP1 may be disposed to overlap the end of the first anode line AL1, and may be connected with the second capacitor pattern portion CP2 of the first capacitor Cst1 through a line L that bypasses the second welding point WP2. At this time, the first protrusion portion PP1 and the line L may be extended from the second capacitor electrode CE2 of the second capacitor pattern portion CP2.

Therefore, at least a portion of the first anode line AL1 may overlap the second capacitor pattern portion CP2 of the first capacitor Cst1 of the first subpixel P1 adjacent thereto in the second direction, more specifically the second capacitor electrode CE2 of the second capacitor pattern portion CP2, whereby the first welding point WP1 may be provided.

The second anode line AL2 may be provided between two second subpixels P2 facing each other with the transmissive area TA interposed therebetween. The second anode line AL2 may be protruded from the first electrode 120 of one of the two second subpixels P2 facing each other with the transmissive area TA interposed therebetween, and may be extended toward the other second subpixel P2.

The second subpixels P2 may be disposed to face each other in the second direction with the transmissive area TA interposed therebetween. In this case, the second anode line AL2 may be extended from the first electrode 120 of each of the second subpixels P2 in the second direction, and at least a portion thereof may overlap the second capacitor Cst2 connected with the second driving transistor DT2 of the second subpixel P2 adjacent thereto in the second direction.

For example, the second anode line AL2 may be protruded from the first electrode 120 of each of the second subpixels P2 and extended in the second direction along the third side of the transmissive area TA. The second capacitor Cst2 may be disposed between the first signal line SL1 and the transmissive area TA at the second side of the first signal line SL1, and the second capacitor pattern portion CP2 may be disposed between the second signal line SL2 and the transmissive area TA by being bent at one end of the first capacitor pattern portion CP1. The second capacitor electrode CE2 of the second capacitor pattern portion CP2 may be provided with a second protrusion portion PP2 protruded toward the transmissive area TA to contact the second anode line AL2. Therefore, at least a portion of the second anode line AL2 may overlap the second capacitor pattern portion CP2 of the second capacitor Cst2 of the second subpixel P2 adjacent thereto in the second direction, more specifically the second capacitor electrode CE2 of the second capacitor pattern portion CP2, whereby the second welding point WP2 may be provided.

The third anode line AL3 may be provided between two third subpixels P3 disposed to be adjacent to each other in the second direction. The third anode line AL3 may be protruded from the first electrode 120 of one of the two third subpixels P3 disposed to be adjacent to each other in the second direction, and may be extended toward the other third subpixel P3.

The third subpixels P3 may be disposed in the second direction with the first subpixel P1 interposed therebetween. In this case, the third anode line AL3 may be extended from the first electrode 120 of each of the third subpixels P3 in the second direction to pass through the first subpixel P1, and then at least a portion thereof may overlap the third capacitor Cst3 connected with the third driving transistor DT3 of the third subpixel P3 adjacent thereto in the second direction.

As shown in FIG. 15, the second subpixel P2 and the fourth subpixel P4 may be disposed in the area where the first signal line SL1 and the second signal line SL2 overlap each other. In this case, the third anode line AL3 may pass through the first subpixel P1 after passing between the second subpixel P2 and the fourth subpixel P4, and then at least a portion thereof may overlap the third capacitor Cst3 of the third subpixel P3 adjacent thereto in the second direction.

For example, the third anode line AL3 may be protruded from the first electrode 120 of each of the third subpixels P3 and then extended between the second subpixel P2 and the fourth subpixel P4. The third anode line AL3 may be extended in the second direction along one side of the first subpixel P1. At this time, the third anode line AL3 may be extended between the first subpixel P1 and the transmissive area TA.

The first capacitor pattern portion CP1 of the third capacitor Cst3 may be disposed between the first signal line SL1 and the transmissive area TA at the second side of the first signal line SL1, and the second capacitor pattern portion CP2 may be disposed between the second signal line SL2 and the transmissive area TA by being bent at one end of the first capacitor pattern portion CP1. The second capacitor electrode CE2 of the second capacitor pattern portion CP2 may include a first protrusion portion PP1 protruded toward the transmissive area TA to contact the third anode line AL3 of the third subpixel P3 disposed to be adjacent thereto in the second direction.

The third anode line AL3 may not be extended to the second capacitor pattern portion CP2 of the third capacitor Cst3 provided in the third subpixel P3 adjacent thereto. Therefore, the third anode line AL3 may not overlap the fourth anode line AL4. In this case, the first protrusion portion PP1 may be disposed to overlap the end of the third anode line AL3, and may be connected with the second capacitor pattern portion CP2 of the third capacitor CST3 through a line L that bypasses the fourth welding point WP4. At this time, the first protrusion portion PP1 and the line L may be extended from the second capacitor electrode CE2 of the second capacitor pattern portion CP2.

Therefore, at least a portion of the third anode line AL3 may overlap the second capacitor pattern portion CP2 of the third capacitor Cst3 of the third subpixel P3 adjacent thereto in the second direction, more specifically the second capacitor electrode CE2 of the second capacitor pattern portion CP2, whereby the third welding point WP3 may be provided.

The fourth anode line AL4 may be provided between two fourth subpixels P4 facing each other with the transmissive area TA interposed therebetween. The fourth anode line AL4 may be protruded from the first electrode 120 of one of the two fourth subpixels P4 facing each other with the transmissive area TA interposed therebetween, and may be extended toward the other fourth subpixel P4.

The fourth subpixels P4 may be disposed to face each other in the second direction with the transmissive area TA interposed therebetween. In this case, the fourth anode line AL4 may be extended from the first electrode 120 of each of the fourth subpixels P4 in the second direction, and at least a portion thereof may overlap the fourth driving transistor DT4 or the fourth capacitor Cst4 of the fourth subpixel P4 adjacent thereto in the second direction.

For example, the fourth anode line AL4 may be protruded from the first electrode 120 of each of the fourth subpixels P4 and extended in the second direction along the fourth side facing the third side of the transmissive area TA. The fourth capacitor Cst4 may be disposed between the first signal line SL1 and the transmissive area TA at the first side of the first signal line SL1, and the second capacitor pattern portion CP2 may be disposed between the second signal line SL2 and the transmissive area TA by being bent at one end of the first capacitor pattern portion CP1. The second capacitor electrode CE2 of the second capacitor pattern portion CP2 may be provided with a protrusion portion PP protruded toward the transmissive area TA to contact the fourth anode line AL4. Therefore, at least a portion of the fourth anode line AL4 may overlap the second capacitor pattern portion CP2 of the fourth capacitor Cst4 of the fourth subpixel P4 adjacent thereto in the second direction, more specifically the second capacitor electrode CE2 of the second capacitor pattern portion CP2, whereby the fourth welding point WP4 may be provided.

Each of the first to fourth anode lines AL1, AL2, AL3 and AL4 disposed as above may be connected with the first electrode 120 of the subpixel at one end. In addition, each of the first to fourth anode lines AL1, AL2, AL3 and AL4 may electrically be separated from the driving transistor DT or the capacitor Cst at the welding points WP1, WP2, WP3 and WP4 provided at the other end thereof with at least one insulating layer interposed therebetween.

As a result, the signal applied to one subpixel may not be applied to the other subpixel adjacent thereto until the repair process is performed. However, when a defect occurs in the driving transistor of one subpixel, the repair process of connecting the subpixel having a defect with a normal subpixel may be performed.

In the transparent display panel 110 according to other embodiment of the present disclosure, when a defective subpixel occurs, the defective subpixel may be connected with its adjacent subpixel by the anode line AL. At this time, the anode line AL may be provided on the same layer as the first electrode 120 of the defective subpixel and then extended from the first electrode 120. Since the anode line AL is connected with the first electrode 120 without a separate contact hole at one end, only one welding point WP may be provided at the other end.

In the transparent display panel 110 according to other embodiment of the present disclosure, since only one welding point WP for irradiating a laser to connect a defective subpixel with a normal subpixel is provided, the number of times for irradiating the laser and an area to where the laser is irradiated may remarkably be reduced during the welding process. Therefore, the transparent display panel 110 according to other embodiment of the present disclosure may reduce an influence on the circuit area or the light emitting element as the laser is irradiated.

In addition, the transparent display panel 110 according to other embodiment of the present disclosure may reduce the area where the welding point WP is provided in the transmissive area TA by reducing the number of welding points WP. Therefore, the transparent display panel 110 according to other embodiment of the present disclosure may reduce or minimize deterioration of light transmittance, which is caused by the formation of the welding point WP.

In addition, in the transparent display panel 110 according to other embodiment of the present disclosure, the anode line AL of the defective subpixel may directly be connected with the second capacitor electrode CE2 of the capacitor Cst of the normal subpixel at the welding point WP. Therefore, even though a short occurs between the first electrode 140 of the normal subpixel and the second electrode 140 due to particles, the signal from the driving transistor DT of the normal subpixel may be applied to the defective subpixel. In this case, the defective subpixel may indicate a subpixel having a defect occurring in the driving transistor DT, and the normal subpixel may indicate a subpixel having no defect in the driving transistor DT.

In addition, in the transparent display panel 110 according to other embodiment of the present disclosure, the anode line AL may be shorter than the spaced distance between adjacent subpixels. In detail, the first anode line AL1 may be shorter than the spaced distance between the first subpixels P1 adjacent to each other in the second direction, and the second anode line AL2 may be shorter than the spaced distance between the second subpixels P2 adjacent to each other in the second direction. In addition, the third anode line AL3 may be shorter than the spaced distance between the third subpixels P3 adjacent to each other in the second direction, and the fourth anode line AL4 may be shorter than the spaced distance between the fourth subpixels P4 adjacent to each other in the second direction.

As described above, in the transparent display panel 110 according to other embodiment of the present disclosure, the anode line AL is formed to be shorter than the spaced distance between the adjacent subpixels, whereby the total length of the anode line AL may be reduced. Therefore, the transparent display panel 110 according to other embodiment of the present disclosure may reduce loss of transparency, which is caused by the anode line AL.

According to the present disclosure, the following advantageous effects may be obtained.

In the present disclosure, the defective subpixel may be connected with its adjacent subpixel by the anode line extended from the first electrode. Therefore, in order to connect the defective subpixel with the normal subpixel, only one welding point for irradiating a laser may be provided, whereby the number of times for irradiating the laser and an area to where the laser is irradiated may remarkably be reduced during the welding process.

In addition, in the present disclosure, as the laser is irradiated, the influence on the circuit area or the light emitting element may be reduced.

In addition, in the present disclosure, as the number of welding points is reduced, the area where the welding point is provided in the transmissive area may remarkably be reduced. Therefore, the present disclosure may reduce or minimize deterioration of light transmittance, which is caused by the formation of the welding point.

In addition, in the present disclosure, the anode line of the defective subpixel may directly be connected with the driving transistor or the capacitor of the normal subpixel. Therefore, in the present disclosure, even though a short occurs between the first electrode of the normal subpixel and the second electrode due to particles, the signal from the driving transistor of the normal subpixel may be applied to the defective subpixel.

In addition, the present disclosure, as the length of the anode line is shorter than the spaced distance between adjacent subpixels, the total length of the anode line may be reduced. Therefore, the present disclosure may reduce loss of transparency, which is caused by the anode line.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
 a substrate having thereon transmissive areas, a non-transmissive area disposed between the transmissive areas, and a plurality of subpixels disposed in the non-transmissive area;
 a first electrode provided in each of the plurality of subpixels;
 a driving transistor supplying a power source to the first electrode of each of the plurality of subpixels, and including an active layer, a gate electrode, a source electrode, and a drain electrode;
 a capacitor coupled to the driving transistor of each of the plurality of subpixels, and including a first capacitor electrode and a second capacitor electrode; and
 an anode line extended from the first electrode of each of the plurality of subpixels and at least partially overlapping a driving transistor or a capacitor of an adjacent subpixel of a same color,
 wherein the non-transmissive area includes a first non-transmissive area extended in a first direction and a second non-transmissive area extended in a second direction between the transmissive areas,
 wherein the plurality of subpixels includes a plurality of first subpixels disposed along the second direction in the second non-transmissive area, emitting light of a first color, and a plurality of second subpixels disposed along the first direction in the first non-transmissive area, emitting light of a second color, and
 wherein the anode line includes a first anode line extended from the first electrode of each of the plurality of first subpixels to at least partially overlap a driving transistor or a capacitor of the first subpixel adjacent thereto, and a second anode line extended from the first electrode of each of the plurality of second subpixels to at least partially overlap a driving transistor or a capacitor of the second subpixel adjacent thereto.

2. The transparent display device of claim 1, wherein the second capacitor electrode of the capacitor is extended from either the source electrode or the drain electrode of the driving transistor.

3. The transparent display device of claim 1, wherein at least a portion thereof overlaps at least one of a source electrode, a drain electrode, or a second capacitor electrode of an adjacent subpixel of a same color to form a welding point.

4. The transparent display device of claim 3, wherein the anode line is directly connected with at least one of the source electrode, the drain electrode, or the second capacitor electrode of the adjacent subpixel of a same color when a laser is irradiated to the welding point.

5. The transparent display device of claim 1, wherein the first subpixels are disposed to face each other in the first direction with the transmissive area interposed therebetween, and wherein the second subpixels are disposed to face each other in the second direction with the transmissive area interposed therebetween.

6. The transparent display device of claim 1, wherein the first anode line is extended from the first electrode of each of the plurality of first subpixels in the first direction and at least partially overlaps the driving transistor or the capacitor of the first subpixel adjacent thereto in the first direction, and wherein the second anode line is extended from the first electrode of each of the plurality of second subpixels in the second direction and at least partially overlaps the driving transistor or the capacitor of the second subpixel adjacent thereto in the second direction.

7. The transparent display device of claim 6, wherein the first anode line is shorter than a spaced distance between the first subpixels adjacent to each other in the first direction, and wherein the second anode line is shorter than a spaced distance between the second subpixels adjacent to each other in the second direction.

8. The transparent display device of claim 1, wherein the first anode line is extended from the first electrode of each of the plurality of first subpixels in the second direction to at least partially overlap the capacitor of the first subpixel adjacent thereto in the second direction, and wherein the second anode line is extended from the first electrode of each of the plurality of second subpixels in the second direction to at least partially overlap the capacitor of the second subpixel adjacent thereto in the second direction.

9. The transparent display device of claim 8, wherein the first anode line is shorter than a spaced distance between the first subpixels adjacent to each other in the second direction, and wherein the second anode line is shorter than a spaced distance between the second subpixels adjacent to each other in the second direction.

10. The transparent display device of claim 1, further comprising:

a first signal line extended in the first direction between the transmissive areas; and a second signal line extended in the second direction between the transmissive areas, wherein the capacitor includes a first capacitor pattern portion longitudinally provided in the first direction between the first signal line and the transmissive area, and a second capacitor pattern portion extended from one end of the first capacitor pattern portion and longitudinally provided in the second direction between the second signal line and the transmissive area.

11. The transparent display device of claim 10, wherein the first anode line is extended from the first electrode of each of the plurality of first subpixels in the first direction and at least partially overlaps the source electrode or the drain electrode of the driving transistor of the first subpixel adjacent thereto in the first direction, and wherein the second anode line is extended from the first electrode of each of the plurality of second subpixels in the second direction and at least partially overlaps the second capacitor electrode provided in the second capacitor pattern portion of the capacitor of the second subpixel adjacent thereto in the second direction.

12. A transparent display device, comprising:

a substrate having thereon transmissive areas, a non-transmissive area disposed between the transmissive areas, and a plurality of subpixels disposed in the non-transmissive area;

a first electrode provided in each of the plurality of subpixels;

a driving transistor supplying a power source to the first electrode of each of the plurality of subpixels, and including an active layer, a gate electrode, a source electrode, and a drain electrode;

a capacitor coupled to the driving transistor of each of the plurality of subpixels, and including a first capacitor electrode and a second capacitor electrode; and an anode line extended from the first electrode of each of the plurality of subpixels and at least partially overlapping a driving transistor or a capacitor of an adjacent subpixel of a same color, wherein the non-transmissive area includes a first non-transmissive area extended in a first direction and a second non-transmissive area extended in a second direction between the transmissive areas, wherein the plurality of subpixels includes a plurality of first subpixels and a plurality of third subpixels alternately disposed in the second non-transmissive area along the second direction, and a plurality of second subpixels and a plurality of fourth subpixels alternately disposed in the first non-transmissive area along the first direction, and wherein the anode line includes a first anode line extended from the first electrode of each of the plurality of first subpixels and coupled with the source electrode or the drain electrode of the first subpixel adjacent thereto, a second anode line extended from the first electrode of each of the plurality of second subpixels and coupled with the source electrode or the drain electrode of the second subpixel adjacent thereto, a third anode line extended from the first electrode of each of the plurality of third subpixels and coupled with the source electrode or the drain electrode of the third subpixel adjacent thereto, and a fourth anode line extended from the first electrode of each of the fourth subpixels and coupled with the source electrode or the drain electrode of the fourth subpixel adjacent thereto.

13. The transparent display device of claim 12, wherein the first anode line and the third anode line are extended along the first direction, and the second anode line and the fourth anode line are extended along the second direction.

14. The transparent display device of claim 12, wherein the transmissive area has a rectangular shape including a first side, a second side facing the first side, a third side coupling one end of the first side with one end of the second side, and a fourth side facing the third side, and one of the first to fourth anode lines is disposed in each of the first to fourth sides of the transmissive area.

15. The transparent display device of claim 14, wherein the first anode line and the third anode line are disposed over the first side and the second side of the transmissive area, respectively, and wherein the second anode line and the fourth anode line are disposed over the third side and the fourth side of the transmissive area, respectively.

16. The transparent display device of claim 14, wherein the first to fourth anode lines are shorter than the first to fourth sides of the transmissive area, respectively.

17. A transparent display device comprising:
a substrate provided thereon with transmissive areas, a non-transmissive area disposed between the transmissive areas, and a plurality of subpixels disposed in the non-transmissive area;
a first electrode provided in each of the plurality of subpixels; and
an anode line disposed between subpixels of a same color, which face each other with the transmissive area interposed therebetween.,
wherein the non-transmissive area includes a first non-transmissive area extended in a first direction and a second non-transmissive area extended in a second direction between the transmissive areas,
wherein the plurality of subpixels includes a plurality of first subpixels disposed along the second direction in the second non-transmissive area, emitting light of a first color, and a plurality of second subpixels disposed along the first direction in the first non-transmissive area, emitting light of a second color, and
wherein the anode line includes a first anode line extended from the first electrode of each of the plurality of first subpixels to at least partially overlap a driving transistor or a capacitor of the first subpixel adjacent thereto, and a second anode line extended from the first electrode of each of the plurality of second subpixels to at least partially overlap a driving transistor or a capacitor of the second subpixel adjacent thereto.

18. The transparent display device of claim 17, wherein the anode line is protruded from one first electrode of two subpixels of a same color, which face each other with the transmissive area interposed therebetween, and then, is extended toward the other subpixel.

19. The transparent display device of claim 17, wherein the anode line is shorter than a spaced distance between two subpixels of a same color, which face each other with the transmissive area interposed therebetween.

20. The transparent display device of claim 17, wherein, when at least one of the plurality of subpixels is a defective subpixel in which a defect occurs in a driving transistor, the defective subpixel is coupled to a driving transistor of a subpixel of a same color as the defective subpixel, which faces the defective subpixel with the transmissive area interposed therebetween, through the anode line.

21. The transparent display device of claim 17, wherein the anode line has one end and the other end in a straight line.

22. The transparent display device of claim 17, wherein at least a portion of the anode line overlaps the transmissive area.

23. The transparent display device of claim 17, wherein the transmissive area has a rectangular shape including four sides, and the anode line is disposed over at least two of the four sides of the transmissive area.

24. The transparent display device of claim 17, further comprising:
a driving transistor coupled to the first electrode of each of the plurality of subpixels, including an active layer, a gate electrode, a source electrode, and a drain electrode; and
a capacitor coupled with the driving transistor of each of the plurality of subpixels, including a capacitor including a first capacitor electrode and a second capacitor electrode,
wherein the anode line of a defective subpixel in which a defect occurs in the driving transistor is coupled to the second capacitor electrode of the capacitor and coupled to either the source electrode or the drain electrode of the driving transistor through the second capacitor electrode of the capacitor.

* * * * *